United States Patent
Yamada

(10) Patent No.: US 7,420,379 B2
(45) Date of Patent: Sep. 2, 2008

(54) SEMICONDUCTOR DEVICE TEST METHOD AND SEMICONDUCTOR DEVICE TESTER

(75) Inventor: Keizo Yamada, Tokyo (JP)

(73) Assignee: Topcon Corporation, Itabashi-Ku, Tokyo (JP)

(*) Notice: Subject to any disclaimer, the term of this patent is extended or adjusted under 35 U.S.C. 154(b) by 13 days.

(21) Appl. No.: 11/437,375

(22) Filed: May 19, 2006

(65) Prior Publication Data
US 2006/0261824 A1    Nov. 23, 2006

Related U.S. Application Data

(62) Division of application No. 11/150,967, filed on Jun. 13, 2005, now Pat. No. 7,049,834, which is a division of application No. 10/868,581, filed on Jun. 15, 2004, now Pat. No. 6,914,444, which is a division of application No. 09/865,528, filed on May 29, 2001, now Pat. No. 6,809,534.

(30) Foreign Application Priority Data
May 30, 2000  (JP)  ............................ 2000-160769

(51) Int. Cl.
G01R 31/02  (2006.01)

(52) U.S. Cl. ...................... 324/751; 324/765

(58) Field of Classification Search ........................ None
See application file for complete search history.

(56) References Cited

U.S. PATENT DOCUMENTS

| | | | |
|---|---|---|---|
| 3,614,608 A | 10/1971 | Giedd | |
| 4,949,162 A | 8/1990 | Tamaki et al. | |
| 4,980,639 A | 12/1990 | Yoshizawa et al. | |
| 4,988,877 A | 1/1991 | Stokowksi et al. | |
| 5,001,536 A | 3/1991 | Fukuzawa et al. | |
| 5,089,774 A | 2/1992 | Nakano | |
| 5,132,507 A | 7/1992 | Nakano | |
| 5,280,176 A | 1/1994 | Jach et al. | |
| 5,327,012 A | 7/1994 | Yano et al. | |
| 5,365,034 A | 11/1994 | Kawamura et al. | |
| 5,412,210 A | 5/1995 | Todokoro et al. | |
| 5,453,994 A | 9/1995 | Kawamoto et al. | |
| 5,493,236 A | 2/1996 | Ishii et al. | |

(Continued)

FOREIGN PATENT DOCUMENTS

JP    50-83990    5/1975

(Continued)

OTHER PUBLICATIONS

"An In-Line Contact and Via Hole Inspection Method Using Electron Beam Compsensation Current", Yamada et al., IEEE 1999, Doc. No. 0-7803-5413-3/99/, available from http://www.fabsol.com/us/images/library/21.pdf.

Primary Examiner—Vinh P Nguyen
(74) Attorney, Agent, or Firm—Buchanan Ingersoll & Rooney PC

(57) ABSTRACT

A defective position of a sample to be tested is detected by irradiating the test sample and another test sample with electron beam while scanning the test samples, storing values of current generated in the test samples correspondingly to electron beam irradiation positions as current waveforms and comparing the current waveforms.

16 Claims, 21 Drawing Sheets

U.S. PATENT DOCUMENTS

| | | |
|---|---|---|
| 5,578,821 A | 11/1996 | Meisberger et al. |
| 5,614,833 A | 3/1997 | Golladay |
| 5,637,186 A | 6/1997 | Liu et al. |
| 5,717,204 A | 2/1998 | Meisburger et al. |
| 5,757,198 A | 5/1998 | Shida et al. |
| 5,780,870 A | 7/1998 | Maeda et al. |
| 5,781,017 A | 7/1998 | Cole et al. |
| 5,801,540 A | 9/1998 | Sakaguchi |
| 5,815,002 A | 9/1998 | Nikawa |
| 5,900,645 A | 5/1999 | Yamada |
| 5,903,011 A | 5/1999 | Hatanaka |
| 5,986,263 A * | 11/1999 | Hiroi et al. .................. 250/310 |
| 5,989,919 A | 11/1999 | Aoki |
| 6,037,588 A | 3/2000 | Liu et al. |
| 6,052,478 A | 4/2000 | Wihl et al. |
| 6,078,386 A | 6/2000 | Tsai et al. |
| 6,127,193 A | 10/2000 | Bang et al. |
| 6,141,038 A | 10/2000 | Young et al. |
| 6,169,603 B1 | 1/2001 | Takayama |
| 6,222,195 B1 * | 4/2001 | Yamada et al. ........... 250/492.2 |
| 6,294,919 B1 | 9/2001 | Baumgart |
| 6,317,514 B1 | 11/2001 | Reinhorn et al. |
| 6,407,386 B1 | 6/2002 | Dotan et al. |
| 6,466,315 B1 | 10/2002 | Karpol et al. |
| 6,723,987 B2 | 4/2004 | Ishimoto |
| 6,768,324 B1 | 7/2004 | Yamada et al. |
| 6,787,770 B2 | 9/2004 | Kikuchi et al. |
| 6,850,079 B2 | 2/2005 | Yamada et al. |
| 6,897,440 B1 | 5/2005 | Yamada |
| 7,019,293 B1 | 3/2006 | Hamada |

FOREIGN PATENT DOCUMENTS

| | | |
|---|---|---|
| JP | 62-19707 | 1/1987 |
| JP | 63-009807 | 1/1988 |
| JP | 3-205573 | 9/1991 |
| JP | 4-62857 | 2/1992 |
| JP | 4-337235 | 11/1992 |
| JP | 6-273297 | 9/1994 |
| JP | 7-66172 | 3/1995 |
| JP | 7-122611 | 5/1995 |
| JP | 8-5528 | 1/1996 |
| JP | 8-313244 | 11/1996 |
| JP | 9-61142 | 3/1997 |
| JP | 9-191032 | 7/1997 |
| JP | 57-6310 | 1/1998 |
| JP | 10-62149 | 3/1998 |
| JP | 8-160095 | 6/1998 |
| JP | 10-281746 | 10/1998 |
| JP | 10-300450 | 11/1998 |
| JP | 11-26343 | 1/1999 |
| JP | 11-118738 | 4/1999 |
| JP | 2000-124276 | 4/2000 |
| JP | 2000-164715 | 6/2000 |
| JP | 2000-174077 | 6/2000 |
| JP | 2000-180143 | 6/2000 |

\* cited by examiner

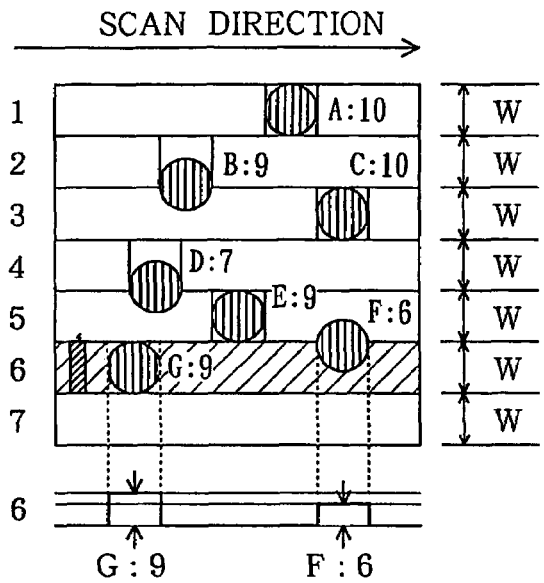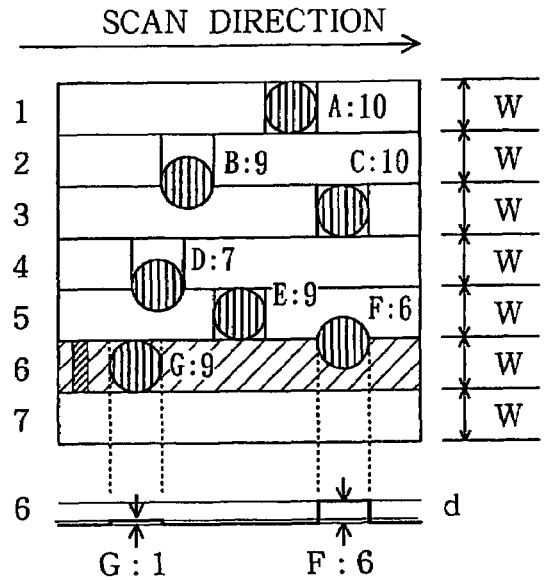
FIG.5a  FIG.5b
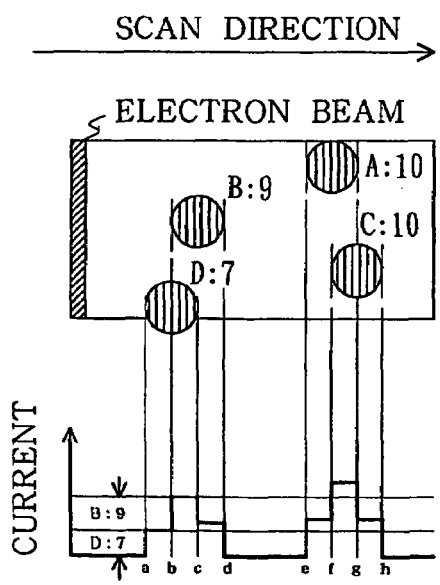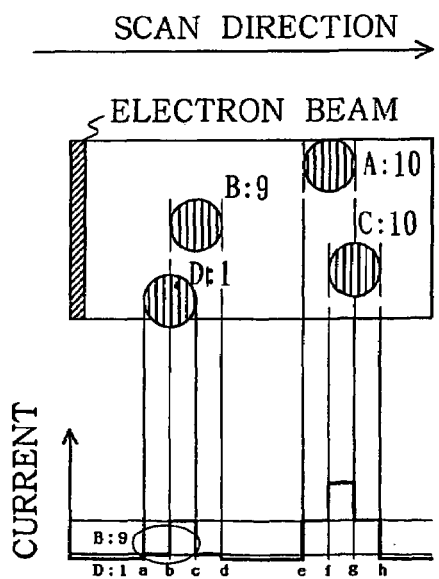
FIG.6a  FIG.6b

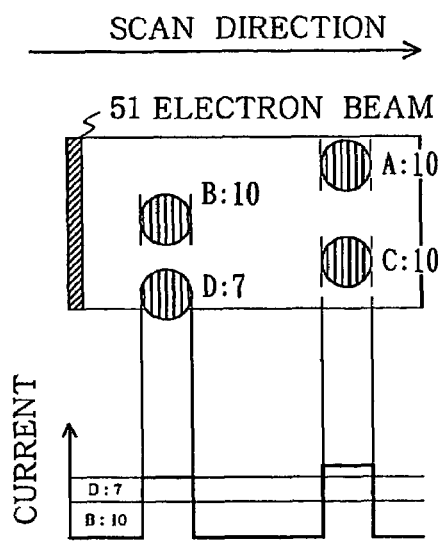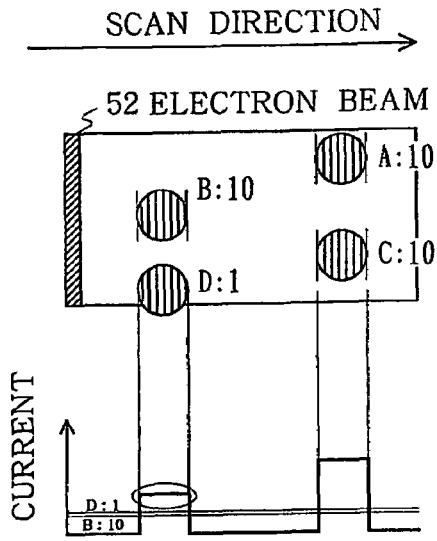
FIG.7a  FIG.7b
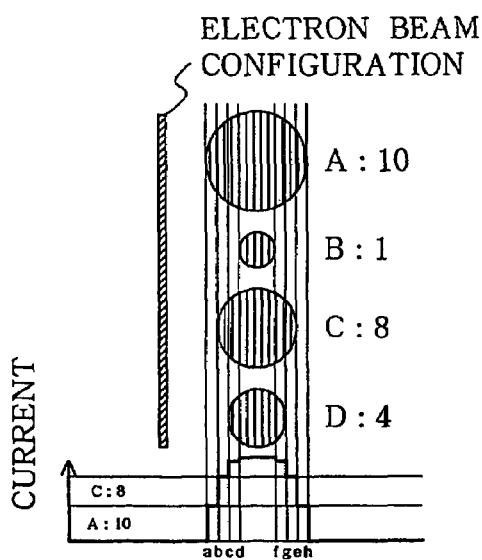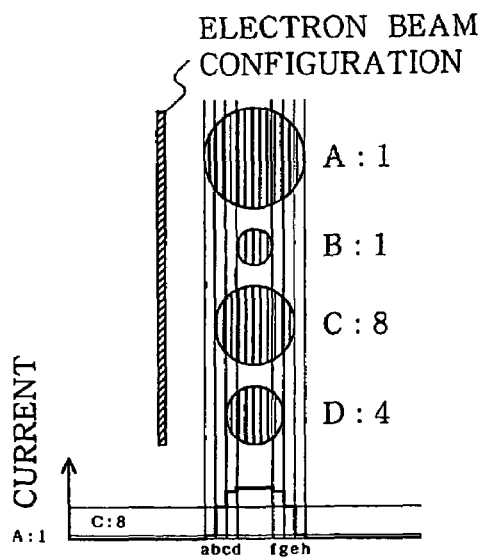
FIG.8a  FIG.8b

SEMICONDUCTOR DEVICE TEST METHOD AND SEMICONDUCTOR DEVICE TESTER

RELATED APPLICATIONS

This application is a divisional application of application Ser. No. 11/150,967, filed on Jun. 13, 2005, now U.S. Pat. No. 7,049,834 which is a divisional of application Ser. No. 10/868,581, filed Jun. 15, 2004 (now U.S. Pat. No. 6,914,444), which is a divisional application of application Ser. No. 09/865,528, filed on May 29, 2001 (now U.S. Pat. No. 6,809,534), which claims the benefit of priority, under 35 USC § 119, to Japanese Patent Application No. 2000-160769, filed on May 30, 2000, the contents of which are incorporated herein by reference.

BACKGROUND OF THE INVENTION

1. Field of the Invention

The present invention relates to a test of a semiconductor device utilizing electron beam. Particularly, the present invention relates to a device test in which the quality of a sample to be tested is determined by measuring electric current flowing through the test sample when the latter is irradiated with electron beam.

2. Description of the Related Art

There has been a semiconductor device tester for testing contact holes or through-holes of a semiconductor device by utilizing electron beam. For example, JP H10-281746A discloses a semiconductor device tester in which a contact hole is irradiated with electron beam and the contact hole is decided as opened when a current flows through the device and decided as not opened when no current flows. In this semiconductor device tester, a diameter of a bottom of the contact hole can be measured by a time difference of current measured correspondingly to electron beam scan time.

With the popularization of SOC (System-On-Chip) semiconductor devices, logic circuits such as memories and CPU, etc., have been formed in a semiconductor device. Since, in general, there is no regularity of layout of a logic circuit, positions of contact holes are generally arranged at random. The above mentioned technique can be utilized in order to test the contact holes arranged at random.

However, in order to reflect the measured current to the quality of the contact hole, it is necessary to know a portion of the measured current corresponding to the contact hole. Therefore, it is necessary to obtain an information of positions of all of contact holes by using CAD data and to prepare the data for every semiconductor device.

On the other hand, with the recent accelerated popularization of semiconductor device integration, semiconductor devices exceeding 10 billions in number can be integrated on one chip. In such case, a memory capacity necessary to memorize a layout of each of layers of the chip becomes several G bytes. It is practically impossible to prepare a tester for one device and there are many kinds of logistic device produced in a mass production factory. Therefore, in order to specify positions of through-holes by using CAD data, it is necessary to accumulate a massive amount of data and it is difficult to accumulate all of the data in a single tester.

SUMMARY OF THE INVENTION

An object of the present invention is to provide a test method of a semiconductor device and a semiconductor device tester with which a correct result of test can be obtained without using CAD data even where through-holes are randomly arranged like a logic circuit.

According to a first aspect of the present invention, a semiconductor device tester including electron beam irradiation means for irradiating a sample to be tested (referred to as "test sample", hereinafter) by scanning a surface of the test sample with electron beam and current measuring means for measuring current generated in the test sample by the irradiation of electron beam is featured by comprising memory means for storing a variation of current value of each of a plurality of test samples which is measured by the current measuring means while moving an irradiating position of electron beam by the electron beam irradiation means as a current waveform corresponding to the electron beam irradiating position, and comparison means for comparing the current waveforms obtained from the plurality of the test samples and stored in the memory means and outputting an information related to positions on the test samples when there is a difference in current value between the stored current waveforms, which exceeds a predetermined value.

Practically, the memory means functions to store the current waveforms obtained in the two test samples formed on one wafer and the comparison means preferably compares the current waveforms of the test samples with each other. However, it is not always necessary to use two test samples formed on the same wafer. On demand, one of the current waveforms to be obtained from two test samples may be preliminarily obtained from one of the two test samples.

It is preferable that the electron beam irradiation means can set a beam width of electron beam to a value substantially equal to a diameter of a contact hole formed in a test sample and, after the test sample is scanned with the electron beam in a scan line direction, can shift the scan line in a direction perpendicular to the scan line direction by a distance corresponding to the width of the electron beam. Further, it is more preferable that the electron beam irradiation means can set a beam width of electron beam to a value smaller than a diameter of a contact hole formed in a test sample and, after the test sample is scanned with the electron beam in a scan line direction, can shift the scan line in a direction perpendicular to the scan direction by a distance substantially equal to the diameter of the contact hole. Further, it is preferable that the electron beam irradiation means can set a width of electron beam such that a plurality of contact holes formed in a test sample are irradiated with the electron beam simultaneously and, after the test sample is scanned with the electron beam in a scan line direction, can shift the scan line in a direction perpendicular to the scan line direction by a distance substantially equal to the beam width. Further, it is preferable that the electron beam irradiation means can set a width of electron beam such that an area of a test sample, which includes a plurality of contact holes, is irradiated with the electron beam simultaneously and, after the test sample is scanned with the electron beam in one scan line direction, can shift the scan line in a direction perpendicular to the scan line direction by a distance substantially equal to the beam width. The electron beam irradiation means may comprise main scan means for scanning a test sample with electron beam by shifting the test sample and sub scan means for deflecting the electron beam in a direction different from the main scan direction while the main scan means is scanning the test sample.

In a case where electron beam having width smaller than the diameter of the contact hole is used, the comparison means may comprise means for comparing instantaneous current values of a plurality of test samples each measured at an intermediate position between a rising edge and a falling edge of a current waveform generated in a certain circuit pattern. Alternatively, in a case where the electron beam having width substantially equal to or smaller than the diameter of the contact hole is used, the comparison means may comprise means for integrating current flowing from a rising edge to a falling edge of a current waveform generated in a certain circuit pattern, divider means for dividing a result of integration from the integrating means by a distance between the rising edge and the falling edge of the current waveform and average value comparison means for comparing average current values obtained by the divider means. The comparison means may comprise integration value comparing means for integrating current values of current waveforms measured at same circuit pattern positions and comparing the integrated current values.

Further, the semiconductor device tester according to the present invention may comprise means for frequency-analyzing measured current waveforms while moving an irradiating position of electron beam and means for grouping positions of the test sample, at which the current waveforms are acquired, every area having same frequency component according to the frequency analysis. In such case, the semiconductor device tester preferably comprises means for setting a test method correspondingly to frequency component of each of grouped areas.

The comparison means may comprise means for calculating an intermediate position between a rising position and a falling position of a pulse contained in a current waveform as a center position of a contact hole and means for comparing relative positions of the center positions of contact holes calculated for two test samples.

According to a second aspect of the present invention, a test method using the above described semiconductor device tester is featured by comprising the steps of irradiating a first test sample, which is formed in a circuit pattern, with electron beam, which has a rectangular cross section and width substantially equal to a diameter of a contact hole, while scanning the electron beam in a direction perpendicular to a longitudinal direction of the rectangular cross section of the electron beam, shifting a scan position in a direction perpendicular to the scan direction by a distance corresponding to the diameter of the contact hole every time when one line scan is completed, storing a current value generated in the first test sample when the latter is irradiated with electron beam as a first current waveform by corresponding the current value to position irradiated with electron beam, irradiating a second test sample, which is formed in the same circuit pattern; with electron beam, which has a rectangular cross section and width substantially equal to a diameter of a contact hole, while scanning the electron beam in a direction perpendicular to a longer side direction of the rectangular cross section of the electron beam, shifting a scan position by a distance corresponding to the diameter of the contact hole in a direction perpendicular to the scan direction every time when one line scan is completed, storing a current value generated in the second test sample when the latter is irradiated with electron beam as a second current waveform by corresponding the current value to position irradiated with electron beam, comparing the first current waveform with the second current waveform and extracting coordinates of a position at which a difference in current value between the first and second current waveforms becomes equal to or larger than a predetermined value.

According to a third aspect of the present invention, a test method using the above described semiconductor device tester is featured by comprising the steps of irradiating a first test sample, which is formed in a circuit pattern, with electron beam having width smaller than a diameter of a contact hole while scanning the electron beam in one direction, shifting a scan position in a direction perpendicular to the scan direction by a distance corresponding to the diameter of the contact hole every time when one line scan is completed, storing a current value generated in the first test sample when the latter is irradiated with electron beam as a first current waveform by corresponding the current value to position irradiated with electron beam, irradiating a second test sample, which is formed in the same circuit pattern, with electron beam having width smaller than a diameter of the contact hole while scanning the electron beam in one direction, shifting a scan position by a distance corresponding to the diameter of the contact hole in a direction perpendicular to the scan direction every time when one line scan is completed, storing a current value generated in the second test sample when the latter is irradiated with electron beam as a second current waveform by corresponding the current value to position irradiated with electron beam, extracting instantaneous current values of the first and second current waveforms each measured at an intermediate position between a rising position and a falling position of each of the first and second current waveforms corresponding to the same circuit pattern, comparing the instantaneous current values with each other and extracting coordinates of a position at which a difference in current value between the first and second current waveforms becomes equal to or larger than a predetermined value.

According to a fourth aspect to the present invention, a test method using the above described semiconductor device tester is featured by comprising the steps of simultaneously irradiating a plurality of contact holes of a first test sample, which are formed in a circuit pattern, with electron beam having a rectangular cross section, while scanning the first test sample with the electron beam in a direction perpendicular to a longer side direction of the rectangular cross section of the electron beam, shifting a scan position in a direction perpendicular to the scan direction by a distance corresponding to a width of the electron beam every time when one line scan is completed, storing a current value generated in the first test sample when the latter is irradiated with electron beam as a first current waveform by corresponding the current value to position irradiated with electron beam, simultaneously irradiating a plurality of contact holes of a second test sample, which are formed in the same circuit pattern, with electron beam having a rectangular cross section, while scanning the second test sample with the electron beam in a direction perpendicular to the longer side direction of the rectangular cross section of the electron beam, shifting a scan position by a distance corresponding to the width of the electron beam in a direction perpendicular to the scan direction every time when one line scan is completed, storing a current value generated in the second test sample when the latter is irradiated with electron beam as a second current waveform by corresponding the current value to position irradiated with electron beam, comparing the first current waveform with the second current waveform and extracting coordinates of a position at which a difference in current value between the first and second current waveforms becomes equal to or larger than a predetermined value.

According to a fifth aspect of the present invention, a test method using the above described semiconductor device tester is featured by comprising the steps of scanning a first test sample with electron beam by simultaneously irradiating an area of the first test sample containing a plurality of contact holes, which are formed in a circuit pattern, with the electron beam, shifting a scan position by a distance corresponding to a diameter of the contact hole in a direction perpendicular to the scan direction every time when one line scan is completed, storing a current value generated in the first test sample when the latter is irradiated with electron beam as a first current waveform by corresponding the current value to position irradiated with electron beam, scanning a second test sample with electron beam by simultaneously irradiating an area of the second test sample, which contains a plurality of contact holes formed in the same circuit pattern, with electron beam, shifting a scan position by a distance corresponding to a diameter of the contact hole in a direction perpendicular to the scan direction every time when one line scan is completed, storing a current value generated in the second test sample when the latter is irradiated with electron beam as a second current waveform by corresponding the current value to position irradiated with electron beam, integrating the first and second current waveforms and comparing the integrated current waveforms and extracting coordinates of a position at which a difference in current value between the first and second current waveforms becomes equal to or larger than a predetermined value.

According to a sixth aspect of the present invention, a test method using the above described semiconductor device tester is featured by comprising the steps of storing a current value generated in a test sample when the test sample is scanned by irradiating the latter with electron beam as a current waveform by corresponding the current value to position irradiated with electron beam, integrating current flowing from a rising edge to a falling edge contained in the current waveform, dividing a result of the integration by a distance between the rising edge and the falling edge of the current waveform, comparing a result of the division with a preliminarily stored reference value and determining the quality of the test sample on the basis of a result of the comparison.

According to a seventh aspect of the present invention, a test method using the above described semiconductor device tester is featured by comprising the steps of scanning a first test sample by irradiating the first test sample, which is formed in a circuit pattern, with electron beam, storing a current value generated in the first test sample when the latter is irradiated with electron beam as a first current waveform by corresponding the current value to position irradiated with electron beam, integrating a current flowing from a rising edge to a falling edge contained in the current waveform, obtaining a first mean value by dividing a result of the integration by a distance between the rising edge and the falling edge of the current waveform, scanning a second test sample by irradiating the second sample, which is formed in the circuit pattern, with the electron beam, storing a current value generated in the second test sample when the latter is irradiated with electron beam as a second current waveform by corresponding the current value to position irradiated with electron beam, integrating a current flowing from a rising edge to a falling edge contained in the current waveform, obtaining a second mean value by dividing a result of the integration by a distance between the rising edge and the falling edge of the current waveform and determining the quality of the first and second samples by comparing the first mean value with the second mean value.

In the test method mentioned above, it is possible to alternately perform a sub scan of a constant amount in a second direction different from a first direction along which a main scan of electron beam is performed or a third direction opposite to the second direction, every time when the main scan of electron beam proceeds in the first direction by a distance corresponding to a diameter of a contact hole contained in a test sample.

It is possible to group positions, at which current waveforms are acquired, every area having same frequency component by frequency-analyzing at least one of the current waveforms. In such case, it is possible to set one of the test methods to every grouped area correspondingly to the frequency component thereof.

According to an eighth aspect of the present invention, a test method using the above mentioned semiconductor device tester is featured by comprising the steps of scanning a first test sample, which is formed in a circuit pattern, by irradiating the first test sample with electron beam, storing a current value generated in the first test sample as a first current waveform by corresponding the current to positions of the test sample irradiated with the electron beam, calculating an intermediate position between a rising edge and a failing edge of the first current waveform as a center position of a contact hole, scanning a second test sample, which is formed in the circuit pattern, by irradiating the second test sample with electron beam, storing a current value generated in the second test sample as a second current waveform by corresponding the current to positions of the second test sample irradiated with the electron beam, calculating an intermediate position between a rising edge and a falling edge of the second current waveform as a center position of a contact hole, comparing the center position obtained for the first test sample with the center position obtained for the second test sample and, when a difference in current value between the centers becomes equal to or larger than a predetermined value, extracting coordinates of the corresponding center position.

BRIEF DESCRIPTION OF THE DRAWINGS

Embodiments of the present invention will be described with reference to the accompanying drawings, in which:

FIG. 5*a* shows an example of the test performed by the semiconductor device tester shown in FIG. 1, showing a test area of a normal chip;

FIG. 5*b* shows the example of the test performed by the semiconductor device tester shown in FIG. 1, showing a test area of a defective chip;

FIG. 6*a* and FIG. 6*b* show another example of the test performed by the semiconductor device tester shown in FIG. 1, showing test areas of a normal and defective chips, respectively;

FIG. 7*a* and FIG. 7*b* show another example of the test performed by the semiconductor device tester shown in FIG. 1, showing test areas of a normal and defective chips, respectively;

FIG. 8*a* and FIG. 8*b* show a further example of the test performed by the semiconductor device tester shown in FIG. 1, showing test areas of a normal and defective chips, respectively;

DETAILED DESCRIPTION OF THE PREFERRED EMBODIMENTS

Figure 1:
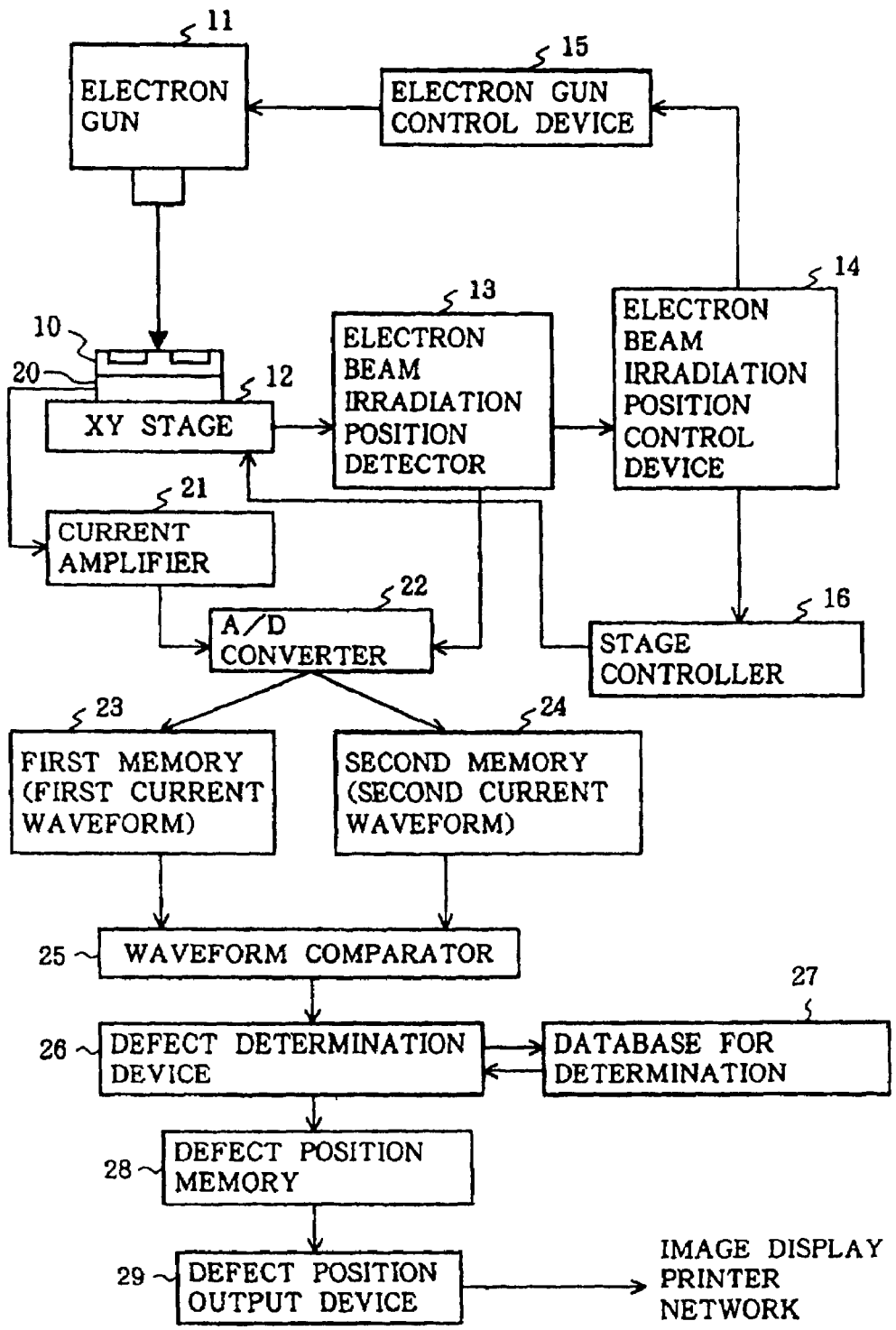
FIG. 1 is a block diagram showing a construction of a semiconductor device tester according to an embodiment of the present invention.
Figure 2:
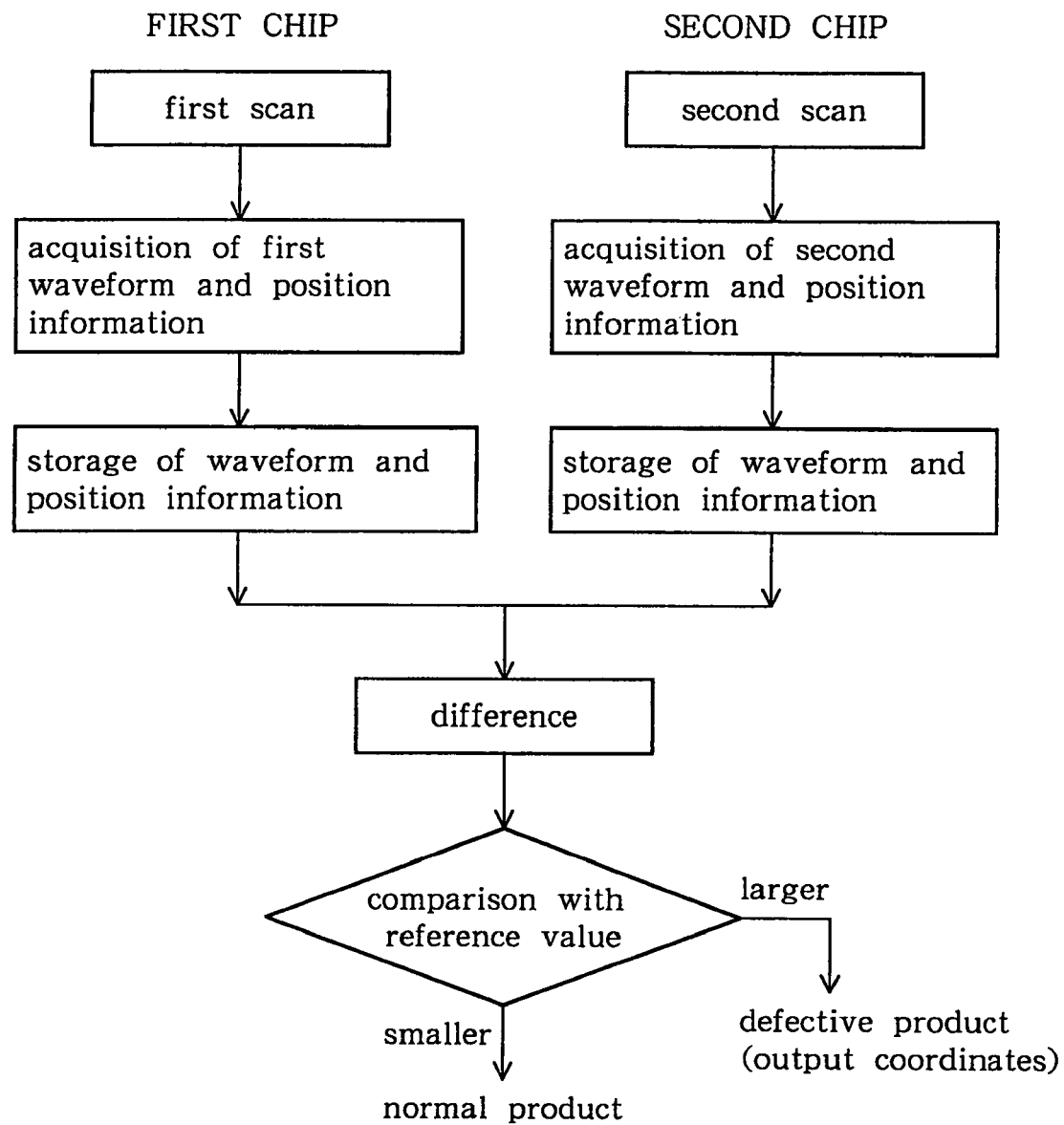
FIG. 2 is a flowchart of a semiconductor device test.

FIG. 1 is a block diagram showing a construction of a semiconductor device tester according to an embodiment of the present invention and FIG. 2 is a flowchart of a device test using the semiconductor device tester shown in FIG. 1.

The semiconductor device tester comprises, as an electron beam irradiation system for vertically irradiating a semiconductor wafer or sample to be tested test with electron beam, an electron gun 11, an XY stage 12 for receiving the test sample 10 and for determining a positional relation between the test sample 10 and electron beam emitted from the electron beam 10, an electron beam irradiating position detector 13 for measuring a position irradiated with electron beam, an electron beam irradiating position control device 14 for controlling a irradiation position of the test sample irradiated with electron beam, an electron gun control device 15 for controlling the electron gun 11 and the XY stage 12 under control of the electron beam irradiating position control device 14 and a stage controller 16. The semiconductor device tester further comprises, as a current measuring and testing system, an electrode 20 provided on the XY stage 12 such that the electrode is in contact with a rear surface of the test sample 10, for measuring a compensation current, a current amplifier 21 for amplifying current flowing through the electrode 20, an A/D converter 22 for converting an output current value from the current amplifier 21 and the positional information from the electron beam irradiating position detector 13 into digital signals, memories 23 and 24 for storing the converted digital signals, respectively, a waveform comparator 25 for comparing the signal waveforms stored in the memories 23 and 24, a defective chip determination device 26 for determining the quality of contact hole on the basis of a result of comparison from the waveform comparator 25, a database 27 for storing an information with which the defective chip determination device 26 determines the quality of contact hole, a defect position memory 28 for storing a position of the contact-hole determined as defective and a defect position output device 29 for outputting the defect position to an image display, a printer or a network.

As the electron beam irradiating position detector 13, an optical precision distance meter may be used. The memories 23 and 24 store current waveforms corresponding to two samples or chips to be tested, separately. However, it is possible to use a single memory in lieu of the memories 23 and 24. Further, the memories 23 and 24 may be used as the defect position memory 28. The defect position memory 28 can rank the defectiveness on demand and store the position information of every rank according to a ranking specification obtained by the ranking.

The scanning with electron beam is performed by fixing the electron gun 11 in a specific position and moving the XY stage 12 relative to the position of the electron gun 11. The position of the XY stage 12 is measured by the electron beam irradiating position detector 13. When an optical precision distance meter is used as the electron beam irradiating position detector 13, it is possible to measure the irradiating position of electron beam with preciseness as high as 100 angstrom. Current generated in a first sample to be tested is measured by the current amplifier 21 and the A/D converter 22 as a first current waveform while the first test sample is scanned with electron beam moving along a line and the first current waveform is stored in the first memory 23 together with coordinates of the first electron beam irradiating position obtained from an output of the electron beam irradiating position detector 13. A similar measurement is performed for a second sample to be tested in the same pattern location of another chip to obtain a second current waveform and the second current waveform is stored in the second memory 24 together with coordinates of the second electron beam irradiating position obtained from an output of the electron beam irradiating position detector 13. Then, the waveform comparator 25 detects a difference between the first and second current waveforms and the defect determination device 26 compares the difference with a reference value read out from the database 27. When the difference is smaller than the reference value, the test sample can be determined as normal. On the other hand, when the difference is larger than the reference value, the defect determination device 26 determines the test sample as defective and stores the coordinates of the electron beam irradiating position corresponding to the defective location in the defect position memory 28. The defect position output device 29 outputs the information stored in the defect position memory 28 to an image display, a printer or other devices through a network.

Figure 3:
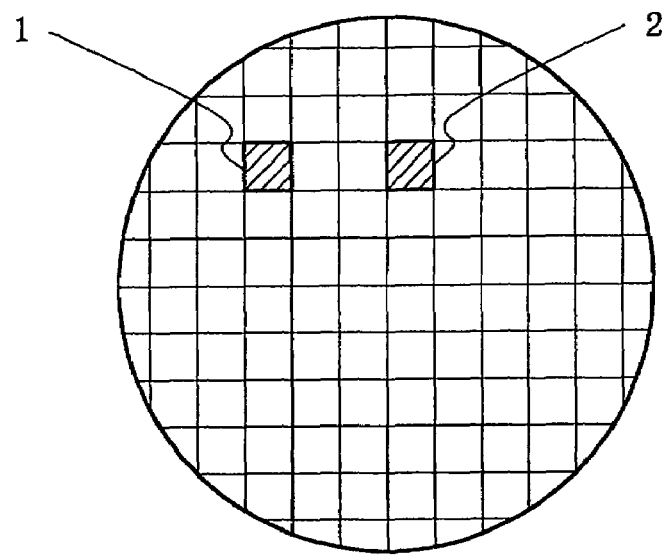
FIG. 3 shows a positional relation between a first sample to be tested and a second sample to be tested.
Figure 4:
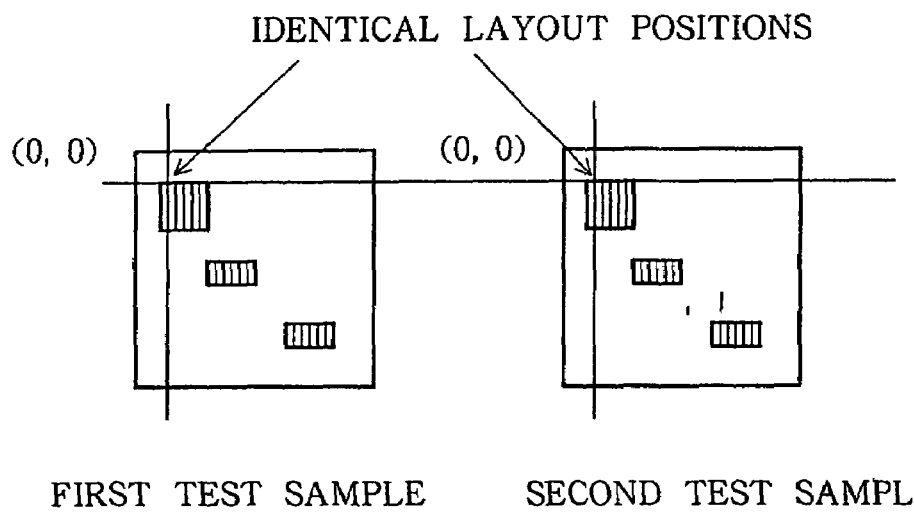
FIG. 4 shows portions of FIG. 3 in an enlarged scale.

FIG. 3 shows a positional relation between the first and second samples to be tested in this and other embodiments of the present invention and FIG. 4 shows a portion thereof in an enlarged scale. Two test samples 1 and 2 are formed on a single substrate and correspond to areas, which are cut apart finally as two chip, respectively. A semiconductor LSI is fabricated by utilizing an exposing device called stepper and an interval between adjacent chips and layouts within the chips are the same. That is, the layout within the chip, which is represented by relative coordinates having an original point (0, 0) set to a corner of the first test sample 1, is exactly coincident with the layout within the chip, which is represented by relative coordinates having an original point (0, 0) set to a corner of the second test sample 2. Therefore, when the areas are compared and there is a variation exceeding a certain reference, the areas can be considered as including defect. In the present invention, it is possible to know only a position in which a contact hole defect is specified by using such comparison regardless of the arrangement of contact holes without obtaining the layout information of the samples to be tested from the CAD data.

In FIG. 3, the two test samples are chips located in separately arranged positions on the same semiconductor wafer. However, the two test samples may be any two chips of a plurality of chips formed simultaneously on a single semiconductor wafer. Although two chips to be relatively tested are different depending upon the case, it is general that one of adjacent chips or one of chips, which is located in a specific position at which a normal product is usually obtained, is selected as the first test sample and the test is performed by sequentially changing the second test sample. The determination of normal or defective contact hole using electron beam utilizes magnitude and/or polarity of current generated when the test sample is irradiated with electron beam. For the sake of simplicity, the following description is based on an assumption that current observed for a defective contact hole is much smaller than that observed for a normal contact hole for the reason that there is etching residue on a bottom of the defective contact hole.

FIG. 5a shows a test area of a normal chip in a test example according to the embodiment shown in FIG. 1 and FIG. 5b shows a test area of a defective chip in the test example according to the embodiment shown in FIG. 1. In FIG. 5a and FIG. 5b, contact holes to be tested are represented by A, B, C, D, E, F and G with maximum current values measured when the contact holes are irradiated with electron beam. Line numbers of electron beam scan are shown on left sides of FIG. 5a and FIG. 5b by numerals 1 to 7. Letters W on right sides of these figures represent a width of the electron beam in each scan. In this example, the size of contact hole to be tested is assumed constant, such as, for example, 0.15 microns as in a usual semiconductor device. In general, an interval of contact holes in a semiconductor device is longer than a diameter of the contact hole due to restriction caused by exposing technique and etching technique of semiconductor device. In this example, the contact holes are arranged at random and have no constant periodicity.

In the example shown in FIG. 5a and FIG. 5b, the maximum current values of the contact holes A, B, C, D, E and F of the normal chip shown in FIG. 5a are 10, 9, 10, 7, 9, 6 and 9, respectively and those of the defective chip shown in FIG. 5b are 10, 9, 10, 7, 9, 6 and 1, respectively. Therefore, it is clear that the contact hole G is defective. In FIG. 5a and FIG. 5b, current values observed when the contact hole G is irradiated with electron beam during $6^{th}$ electron beam scan and corresponding to electron beam scan position are shown.

This test method will be described in more detail.

First, the coordinates of the position of the chip, that is, the test sample, is made coincident with the coordinates of the position in which the electron beam irradiation is performed. Since size of contact hole of the most advanced device as the test sample is 0.2 microns or less, an alignment is performed with positional preciseness higher than 1000 angstrom with which this position coordinates can be reproduced. In order to realize this, an alignment mark formed on the wafer is utilized.

There are some methods for utilizing the alignment mark. In one of them, an alignment mark for a mask alignment used in a usual semiconductor process is utilized. This alignment mark is formed on a surface of a substrate by an oxide film or a metal film and is converted into a secondary electron image by using a scanning microscope provided within the semiconductor device tester. Since the position in the image is a position, which is being correctly irradiated with electron, the position coordinates of the electron beam scanning system is such that the position of the alignment mark becomes the original point of the electron beam scan system.

As another method, which does not use the scan microscope, there is a method for measuring current flowing through the alignment mark. In such case, an alignment mark having configuration similar to that of the contact hole of the sample to be tested is prepared separately. The size of the alignment mark may be similar to that of the contact hole of the test sample. In order to improve the preciseness of measurement, the alignment mark may be smaller than the contact hole of the sample. Similarly to the test principle of contact hole, current observed when electron beam irradiates other position than the alignment mark is small and it is increased when electron beam irradiates the position of the alignment mark. Since, when the position irradiated with electron beam is coincident with the alignment mark, current observed becomes maximum, the position at which the maximum current is observed is utilized as a position, which is coincident with the alignment mark.

After the alignment is completed, an area of the surface of the first test sample, in which the contact holes are formed, is scanned from left to right along the line 1 with a vertical electron beam having a rectangular cross section having a longer side size corresponding to the diameter of the contact hole. When the electron beam reaches an edge of the test area, the electron beam irradiating position is shifted in a direction perpendicular to the scan direction by W and the electron beam scan is repeated along the line 2. The scanning may be performed along an S-shaped path or the scanning may be performed from left to right after returned to the initial position. The amount of vertical shift of the electron beam is set to a value substantially equal to the diameter of the contact hole.

The scanning along the lines 3, 4, 5, 6 and 7 are performed similarly to cover the whole sample to be tested. A timing of comparison between a normal sample and a defective sample is related to a capacity of the memories provided in the semiconductor device tester. When the comparison is performed every line, it is enough to use a memory capable of storing a current waveform corresponding to one scan line. When a defect chip is measured after a whole normal chip is measured, the memory capacity must be enough to store an information of the whole chip. However, in order to improve the test speed, it is preferable that a memory having capacity large enough to store an information of a whole chip and compare an information of a defective chip with the information of the normal chip since it takes much time to move the electron beam irradiating position between chips through a physical distance therebetween.

It is assumed that, as a result of such test, a current having maximum value of 9 is observed for one test sample when the electron beam irradiating position becomes a position corresponding to the contact hole G during a scan along the $6^{th}$ line, while a current having maximum value of 1 is observed for the other test sample when the electron beam irradiating position becomes a position corresponding to the contact hole G during a scan along the 6$^{th}$ line, as shown in FIG. 5. In such case, it is clear that the contact hole G of the other sample is defective. The defect position can be obtained by the electron beam irradiating position measured by the electron beam irradiating position detector 13.

As such, according to this embodiment, it is possible to detect the defective contact hole and specify the position of the defective contact hole even if the position of the contact hole of the test sample is unknown.

FIG. 6a and FIG. 6b to FIG. 9a and FIG. 9b show other examples of the test performed by the semiconductor device tester shown in FIG. 1, in which FIG. 6a, FIG. 7a, FIG. 8a and FIG. 9a show test areas of a normal chip and FIG. 6b, FIG. 7b, FIG. 8b and FIG. 9b shows test areas of a defective chip. Although, in the test example shown in FIG. 5, the width of the electron beam is set to a value substantially equal to the diameter of the contact hole formed in the test sample, the width of electron beam in the test examples shown in FIG. 6a to FIG. 9b is set larger than the diameter of the contact hole so that a plurality of contact holes formed in the test sample can be irradiated simultaneously with electron beam. In detail, electron beam used in these examples has a rectangular cross section about 100 angstrom long in the scan direction and several microns wide. Further, after one scan is completed, the electron beam is shifted perpendicularly to the scan direction by the width of the electron beam and, then, a second scan is performed.

In the test example shown in FIG. 6a and FIG. 6b, the test is performed by irradiating a plurality of randomly arranged identical contact holes with electron beam simultaneously. The side length of the cross section of electron beam in the scan direction is very small and the side of the cross section of electron beam in a direction perpendicular to the scan direction is long enough to cover a plurality of the contact holes. The current value is in a range from several picoamperes to several nanoamperes. For simplicity of description, two contact holes are simultaneously measured in FIG. 6a and FIG. 6b. Numerals given in the right sides of the contact holes show the maximum values of currents flowing through the contact holes when irradiated with electron beam.

In the test example shown in FIG. 6a, which shows a normal chip, current starts to flow when electron beam comes to the contact hole D and, when electron beam comes to the contact hole B, current measured becomes a sum of currents flowing through the contact holes D and B. When electron beam passes the area of the contact hole D, current is reduced and, when electron beam passes through the area of the contact hole D, current becomes zero. On the other hand, in the test example shown in FIG. 6b, which shows a defective chip including a defective contact hole D, current measured at a position a at which electron beam comes to the contact hole D is very small. That is, two current waveforms in a position in which the same contact hole patterns of the normal and defective chips are formed are different from each other. On the other hand, current waveforms measured in positions of the normal chip and the defective chip in which normal contact holes are formed, respectively, are the same. Therefore, it is possible to detect the defective contact hole and to specify the position of the defective contact hole as in the test example shown in FIG. 5a and FIG. 5b.

When a plurality of contact holes are irradiated with electron beam and if a position of the contact hole of the defective chip is deviated from a correct position thereof, there is a large difference in current waveform between the normal chip and the defective chip since currents generated in the respective contact holes are measured separately with respect to the measuring position. Therefore, it is possible to detect the defective contact hole by waveform comparison.

FIG. 7a and FIG. 7b show a test example in which a plurality of contact holes are overlapped vertically. According to the principle of the test of the present invention, the value of current generated by electron beam irradiation is equal to a sum of currents generated in contact holes, which are simultaneously irradiated with electron beam. Therefore, the current value measured when the positions of the contact holes are overlapped becomes a sum of currents generated in the contact holes when the contact holes are irradiated with electron respectively. In the test example of a normal chip shown in FIG. 7a, a maximum current value of 17 is observed when electron beam comes to the contact holes B and D, while, in the test example of a defective chip shown in FIG. 7b, the maximum current value is only 11. Therefore, there is a large difference in current waveforms between the normal chip and the defective chip, so that an existence of defective contact hole is detected.

FIG. 8a and FIG. 8b show a test example in a case where contact holes having different sizes exist in a column. Value of current measured when a line shaped electron beam as used in the test example shown in FIG. 7a and FIG. 7b is used becomes a sum of currents generated when the respective contact holes are irradiated with electron beam. In this example, current of 10 flows in a normal contact hole A of a normal chip as shown in FIG. 8a, while current of 1 flows in a defective contact hole A of a defective chip as shown in FIG. 8b. Therefore, a difference in current waveform exists between the normal chip and the defective chip when electron beam comes to a position a. Since the contribution of current from the contact hole A is small, the current waveform observed subsequently becomes small. Since, in the case where contact holes having different sizes exist in one column, there is the difference in current waveform between the normal chip and the defective chip even when the contact holes are tested simultaneously, so that it is possible to detect the defective contact hole.

Figure 9A:
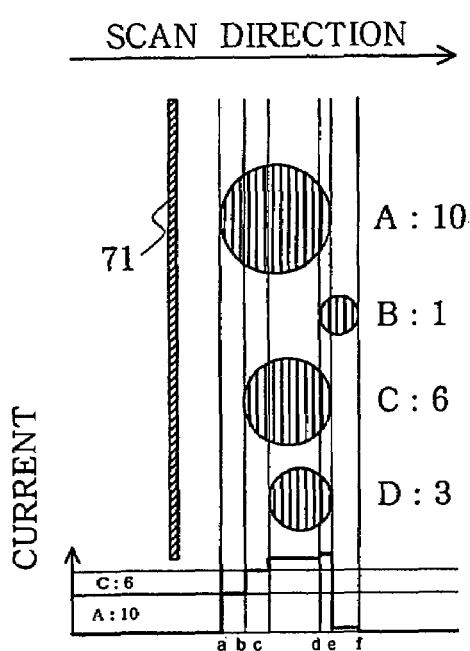
FIG. 9*a* and FIG. 9*b* show a still further example of the test performed by the semiconductor device tester shown in FIG. 1, showing test areas of a normal and defective chips, respectively.
Figure 9B:
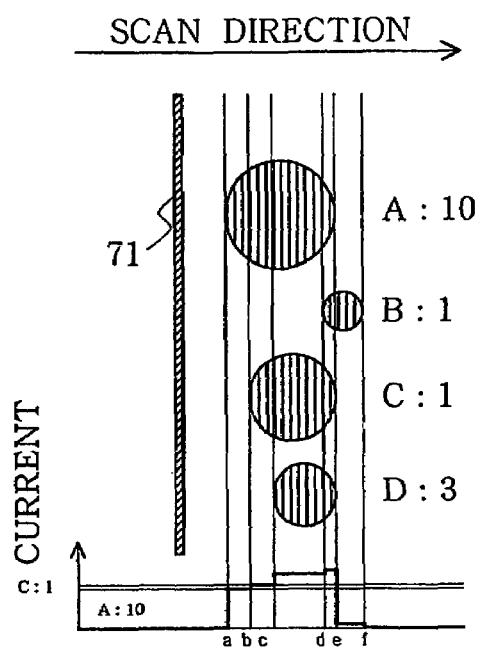

FIG. 9a and FIG. 9b show a test example in a case where contact holes A, B, C and D having different sizes exist at random. In this example, it is assumed that the contact hole C of the defective chip is defective as shown in FIG. 9b. When the chips are scanned by using electron beam similar to that used in the previous examples, amounts of change of current in positions b of the normal chip and the defective chip becomes different as shown in FIG. 9a and FIG. 9b. The defective chip can be detected by detecting the difference.

Figure 10:
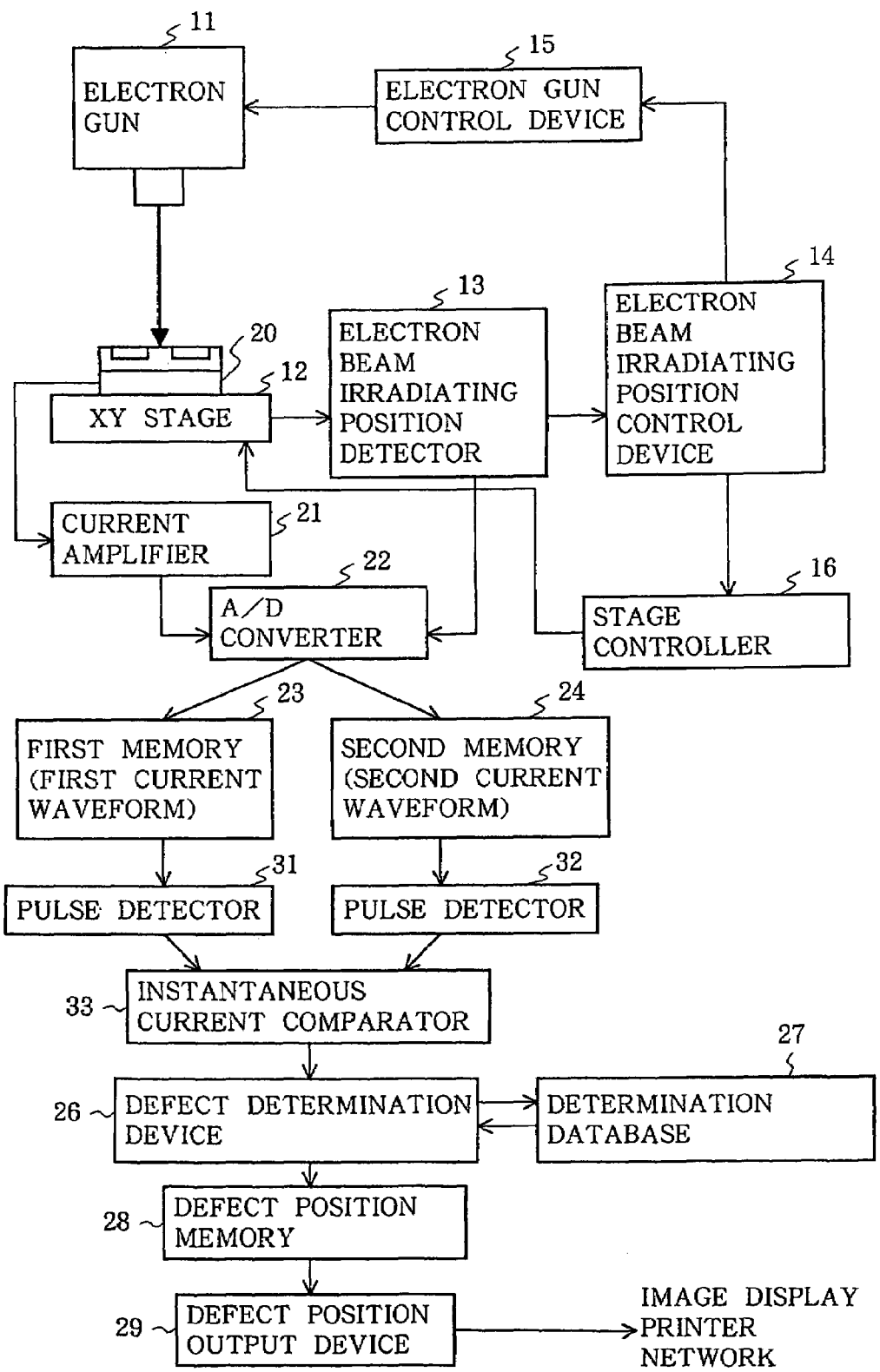
FIG. 10 is a block diagram showing a construction of a semiconductor device tester according to a second embodiment of the present invention.
Figure 11:
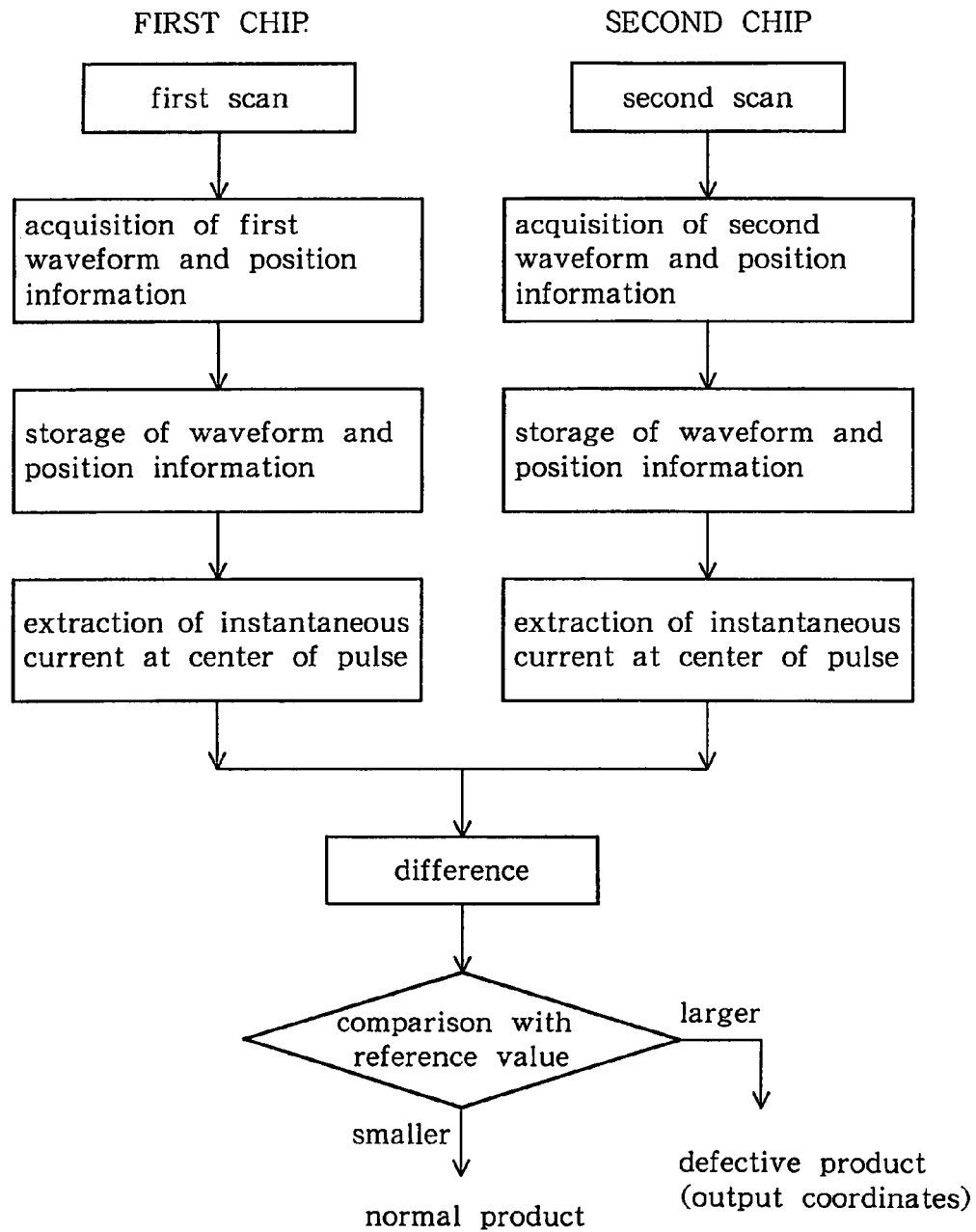
FIG. 11 is a flowchart of a device test using the semiconductor device tester shown in FIG. 10.

FIG. 10 is a block diagram of a semiconductor device tester according to a second embodiment of the present invention and FIG. 11 is a flowchart of a device test performed by the semiconductor device tester shown in FIG. 10.

The semiconductor device tester shown in FIG. 10 differs from the first embodiment in that the semiconductor device tester shown in FIG. 10 comprises, in lieu of the waveform comparator 25 of the first embodiment, pulse detectors 31 and 32 and an instantaneous current comparator 33 and that electron beam emitted from the electron gun 11 has a thin cross section having a size sufficiently smaller than a diameter of a contact hole.

When current generated in a test sample having contact holes whose bottoms are uniform is measured by irradiating it with electron beam, it is general that an amount of current generated per unit area of the bottom is the same. Therefore, it is not always necessary, in order to determine the quality of contact hole, to irradiate the whole contact hole with electron beam at one time. In view of this fact, electron beam used in this embodiment takes in the form of a spot-like electron beam having a cross sectional diameter sufficiently smaller than diameter of the contact hole. A distance between adjacent scan lines of the spot-like electron beam is substantially equal to the diameter of the contact hole. When the test sample is scanned by irradiating it with the electron beam vertically under the above-mentioned conditions, a pulse current is obtained when a normal contact hole portion is scanned. Further, it is general that, even when the normal contact hole is scanned by electron beam, a total current flowing therethrough during the electron beam passes through one contact hole depends upon a position of the contact hole through which electron beam passes. However, an instantaneous current value measured at a center position of a current waveform obtained by the electron beam scan is the same regardless of the position of the contact hole through which electron passes. In view of this fact, in this embodiment, a rising edge and the falling edge of the pulse current waveform are detected, the instantaneous current value measured at the center position of the waveform is obtained and the instantaneous current value is stored together with a position of the test sample irradiated with electron beam. The quality of the contact hole is determined by comparing the instantaneous current value obtained from the test sample with the stored instantaneous current value of a normal contact hole.

Figures 12A, 12B:
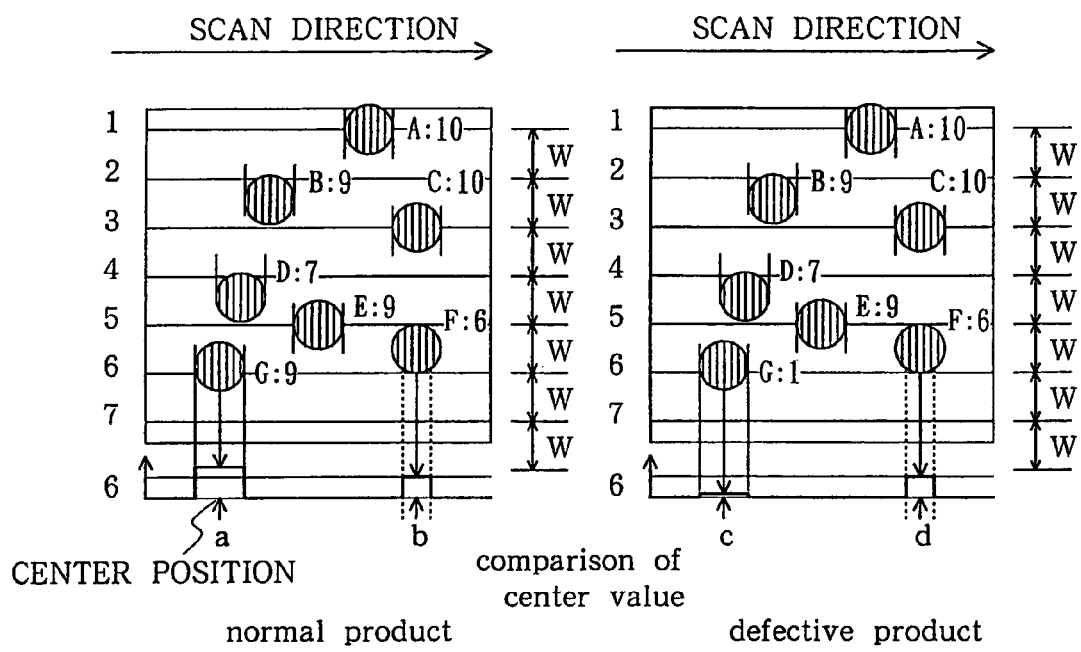
FIG. 12 shows test examples performed by the second embodiment shown in FIG. 10 for similar samples to be tested to those shown in FIG. 5a and FIG. 5b.

FIG. 12a and FIG. 12b show a test example performed for a test sample similar to the test example shown in FIG. 5a and FIG. 5b and tested by using the embodiment shown in FIG. 10, in which FIG. 12a shows a test area of a normal chip and FIG. 12b shows a test area of a defective chip. In FIG. 12a and FIG. 12b, it is dear that, since instantaneous current values measured at a position b corresponding to a center position of the contact hole F of the normal chip and at a position d corresponding to a center position of the contact hole F of the defective chip are the same, the contact holes F of the normal chip and the defective chip are normal contact holes and, since instantaneous current values measured at a position a corresponding to a center position of the contact hole G of the normal chip and at a position c corresponding to a center position of the contact hole G of the defective chip are different, it is determined that one of the contact holes G of the normal chip and the defective chip is a defective contact hole.

This test method will be described in more detail.

After an alignment is completed similarly to the first embodiment, an area of the surface of the normal test sample, in which the contact holes are formed, is scanned from left to right along the line 1 with a vertical electron beam, which is sufficiently thin compared with the diameter of the contact hole. When the electron beam reaches an edge of the test area, the electron beam irradiating position is shifted in a direction perpendicular to the scan direction by W and the electron beam scan is repeated along the line 2. The scanning may be performed along an S-shaped path or the scanning may be performed from left to right after returned to the initial position. The amount of vertical shift W of the electron beam is set to a value substantially equal to the diameter of the contact hole.

The scanning along the lines 3, 4, 5, 6 and 7 are performed similarly to cover the whole test sample.

The scanning with electron beam is performed by fixing the electron gun 11 in a specific position and moving the XY stage 12 relative to the position of the electron gun 11. The position of the XY stage 12 is measured by the electron beam irradiating position detector 13. When an optical precision distance meter is used as the electron beam irradiating position detector 13, it is possible to measure the irradiating position of electron beam with preciseness as high as 100 angstrom. Current generated in a first test sample is measured by the current amplifier 21 and the A/D converter 22 as a first current waveform while the first test sample is scanned with electron beam moving along a line and the first current waveform is stored in the first memory 23 together with coordinates of the first electron beam irradiating position obtained from an output of the electron beam irradiating position detector 13. A similar measurement is performed for a second test sample in the same pattern location of another chip to obtain a second current waveform and the second current waveform is stored in the second memory 24 together with coordinates of the second electron beam irradiating position obtained from an output of the electron beam irradiating position detector 13.

In the first embodiment, the quality of the two test samples is determined by comparing currents generated in the two test samples when the electron beam comes to the position of the contact hole, as mentioned previously. However, when a thin electron beam is used as in the second embodiment, the quality of a test sample is determined by the current value at the center position of the contact hole, that is, instantaneous at a center of the pulse waveform. Therefore, positions of a rising edge and a falling edge of a pulse belonging to a first current waveform are detected by the pulse detector 31 to obtain a center position of the pulse belonging to the first current waveform and an instantaneous value of current measured in that position is extracted. Then, positions of a rising edge and a falling edge of a pulse belonging to a second current waveform are detected by the pulse detector 32 to obtain a center position of the pulse belonging to a second waveform and an instantaneous value of current measured in that position is extracted. Thereafter, the instantaneous current values obtained in mutually corresponding positions are compared by the instantaneous current comparator 33. When the instantaneous current values are different, a contact hole in that position is defective and is stored in the defect position memory 28.

As previously described, in the example shown in FIG. 5a and FIG. 5b, the maximum current of 9 is observed in the $6^{th}$ scan when electron beam comes to the position corresponding to the contact hole G of the first test sample and the maximum current of 1 is observed in the $6^{th}$ scan when electron beam comes to the position corresponding to the contact hole G of the second test sample. Therefore, the contact hole G of the second test sample is determined as defective. In the second embodiment, however, it is determined that there is a defect in one of the contact holes G since the instantaneous current values measured at the positions a and c are different, as shown in FIG. 12a and FIG. 12b.

Figure 13:
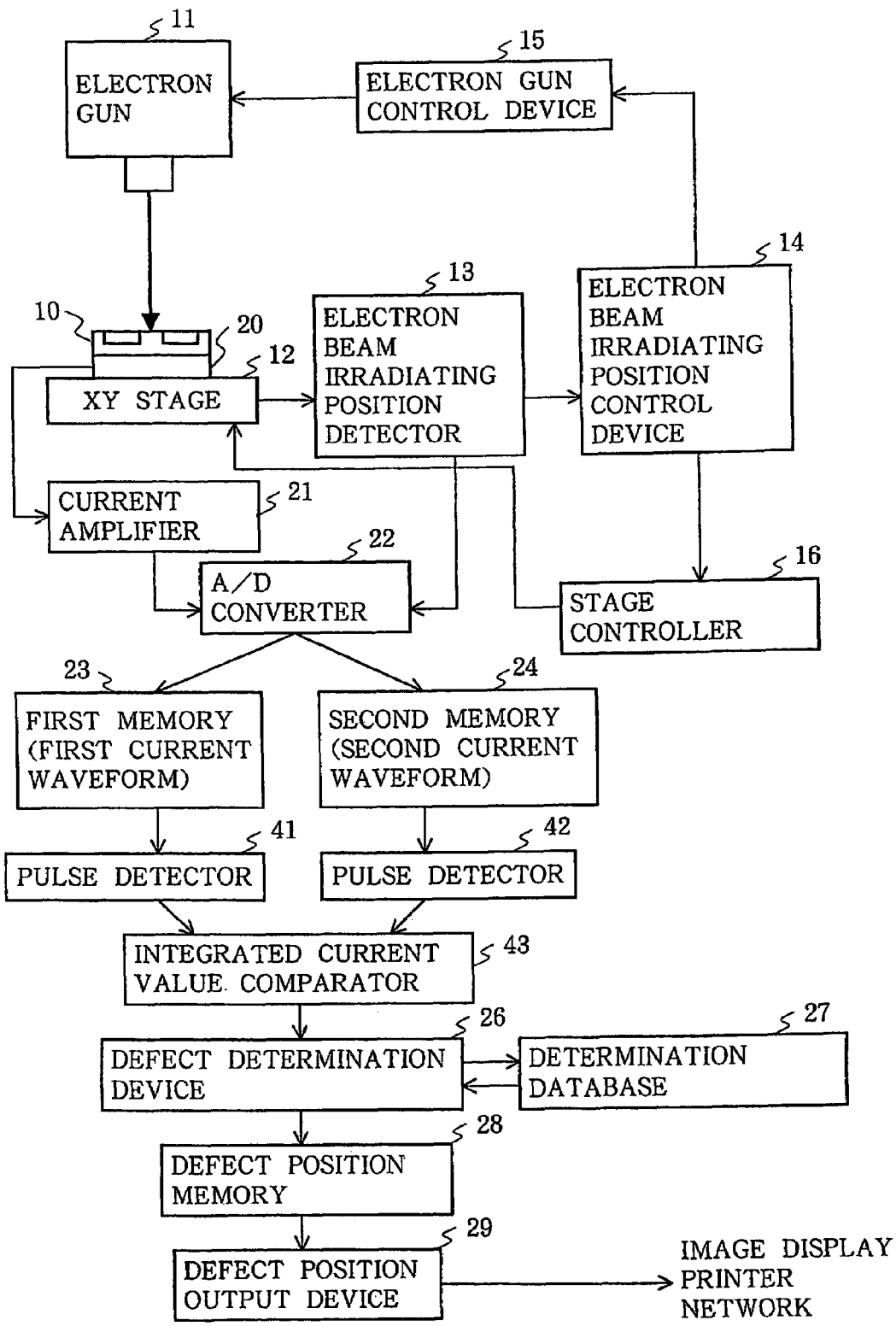
FIG. 13 is a block diagram showing a construction of a semiconductor device tester according to a third embodiment of the present invention.
Figure 14:
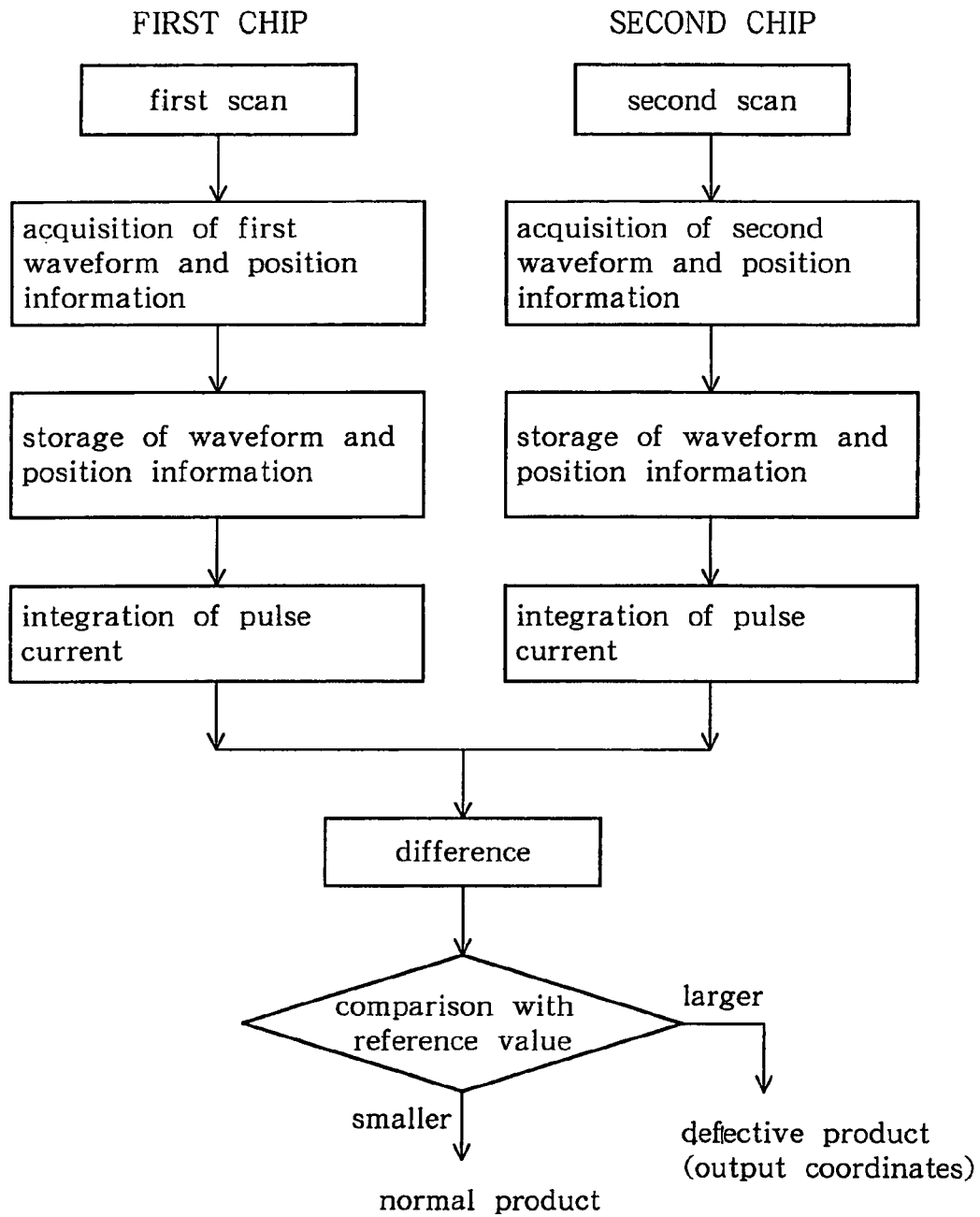
FIG. 14 is a flowchart of a device test using the semiconductor device tester shown in FIG. 13.

FIG. 13 is a block diagram of a semiconductor device tester according to a third embodiment and FIG. 14 is a flowchart showing an operation of the device tester shown in FIG. 13.

The semiconductor device tester according to the third embodiment differs from the first or second embodiment in that it includes, in lieu of the waveform comparator 25 of the first embodiment or the pulse detectors 31 and 32 and the instantaneous current comparator 33 of the second embodiment, pulse integrators 41 and 42 and an integration value comparator 43 and the quality of chip is determined by currents flowing in respective contact holes.

Current waveforms obtained from two test samples are temporarily stored in the memories 23 and 24 together with a position information of them. The temporarily stored information is integrated by the pulse integrators 41 and 42. The integrated values are compared with each other by the integration comparator 43 and the quality of the test samples is determined by referencing a result of the comparison to an information stored in the database 27. Coordinates of a position corresponding to the waveform determined as defective is stored in the defect position memory 28 and outputted from the position information output device 29 to an image display, a printer or a network, etc.

Figure 15:
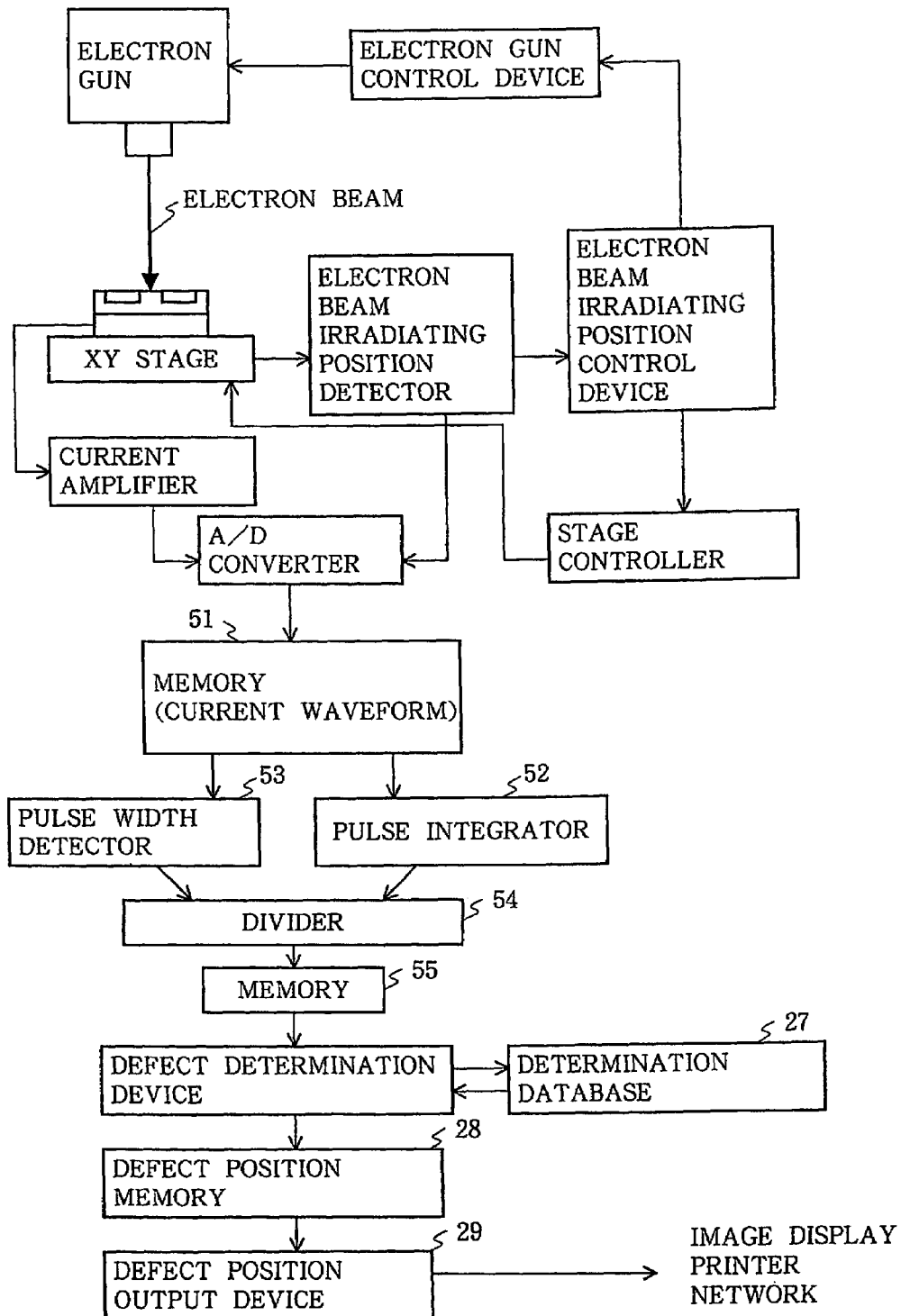
FIG. 15 is a block diagram showing a construction of a semiconductor device tester according to a fourth embodiment of the present invention.
Figure 16:
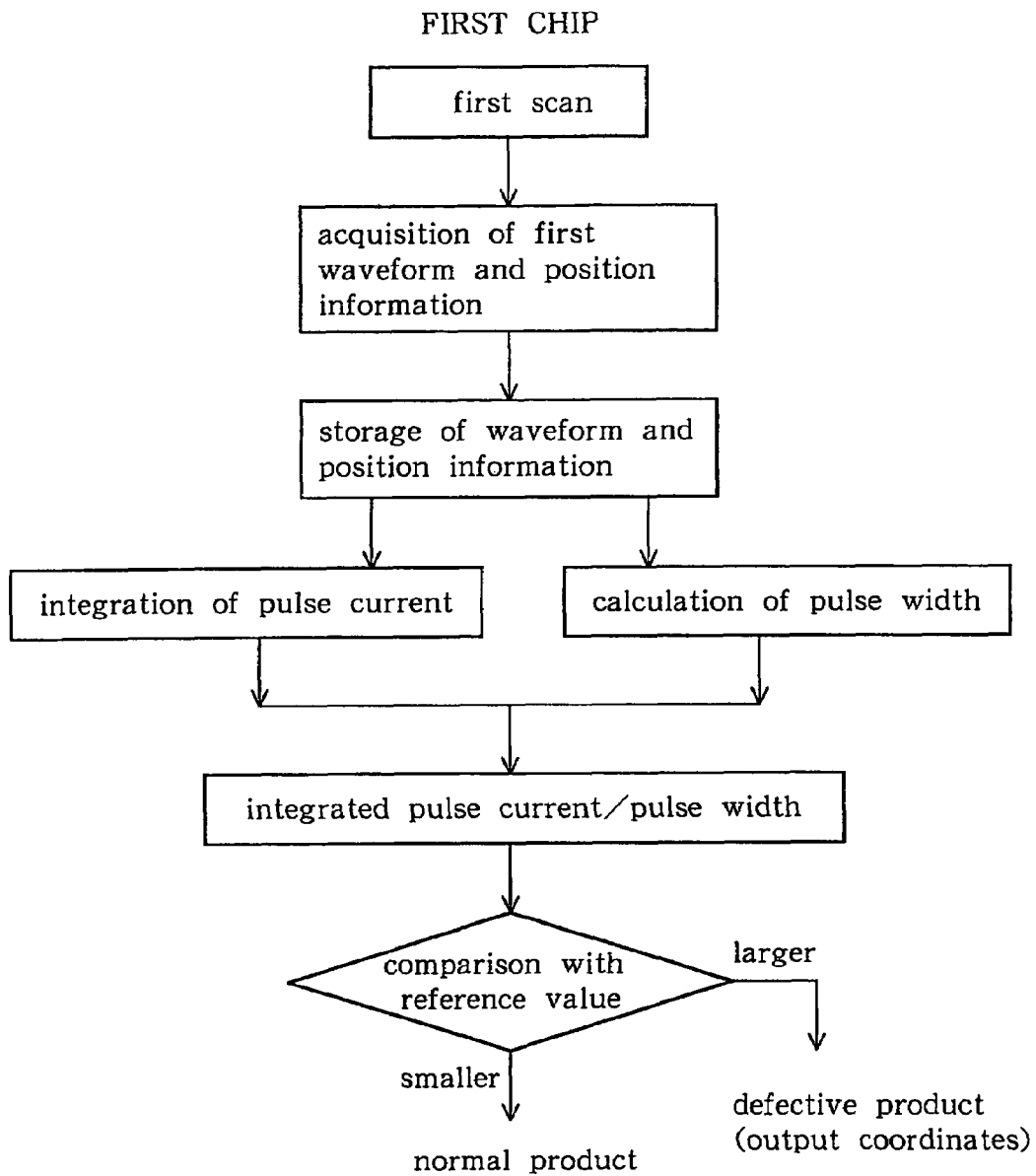
FIG. 16 is a flowchart of a device test using the semiconductor device tester shown in FIG. 15.

FIG. 14 is a block diagram of a semiconductor device tester according to a fourth embodiment and FIG. 15 is a flowchart showing an operation of the semiconductor device tester shown in FIG. 14.

The semiconductor device tester according to the fourth embodiment differs from the first to third embodiments in that the semiconductor device tester shown in FIG. 14 includes, between the A/D converter 22 and the defect determining device 26, a memory 51, a pulse integrator 52, a pulse width detector 53, a divider 54 and a memory 55 and in that the quality of chip is determined on the basis of the current flowing in a unit area of a contact hole.

In the fourth embodiment, a current waveform measured is stored in the memory 51 and a current flown from a rising edge to a falling edge of one pulse belonging to the current waveform is integrated by the pulse integrator 52 to obtain a total current flown in the pulse. Simultaneously therewith, a width L measured from a rising edge to a falling edge of a pulse waveform, which is equal to a crossing distance of the contact hole is obtained by using the pulse width detector 53. Thereafter, the total current is divided by a square of the width L by using the divider 54. According to this arithmetic operation, a value of current flowing through a unit area of the contact hole is obtained regardless of a scan locus of the electron beam. The defect determining device 26 compares the current value per unit area with a reference value preliminarily obtained and stored in the database and determines the quality of the chip on the basis of the difference between the current value per unit area and the reference value.

Figures 17A, 17B:
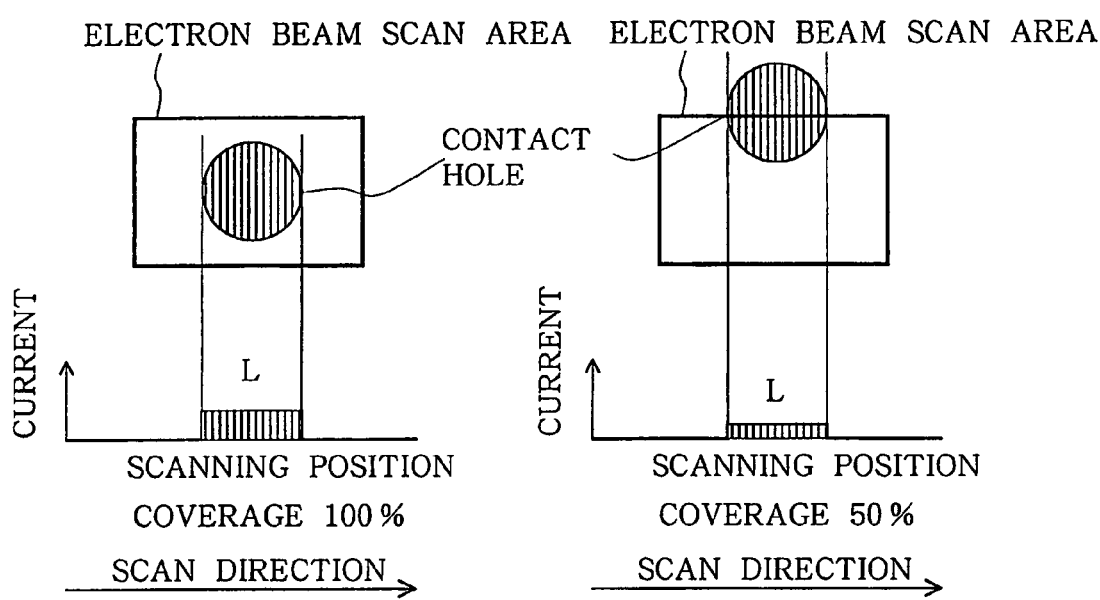
FIG. 17a and FIG. 17b are drawings for explaining the principle of the test, showing examples in cases where the hole coverage of electron beam is 100% and 50%, respectively.

FIG. 17a and FIG. 17b are illustrations explaining the test principle of the fourth embodiment. Since, in the present invention, the position of a defective contact hole is specified without using the coordinates of position from such as CAD, a whole contact hole is not always irradiated with electron beam used in the test. FIG. 17a shows a case of 100% coverage where electron beam passes through a whole area of one contact hole and FIG. 17b shows a case of 50% coverage where electron beam passes through a half of area of one contact hole. A value of current flowing through a normal contact hole having a specific size is constant. From a total current flown from a rising edge to a falling edge of a pulse of a measured current waveform, which corresponds to one contact hole, and a width of the pulse, it is possible to know an area of a normal contact hole through which electron beam passes.

The reference value to be compared with a measured current in determining the quality of contact hole is a current value per unit area of a normal contact hole. Therefore, a value of a contact hole of a chip of other wafer processed through the same steps, data obtained from a test pattern or a value estimated by such as a simulation may be utilized as the reference value. Particularly, since a reference value is the value obtained for the contact hole of the chip of other wafer in the fourth embodiment, the fourth embodiment is utilized when the yield of semiconductor device having normal contact holes within a wafer thereof at the beginning of a process development of the semiconductor device is very low.

Figure 18:
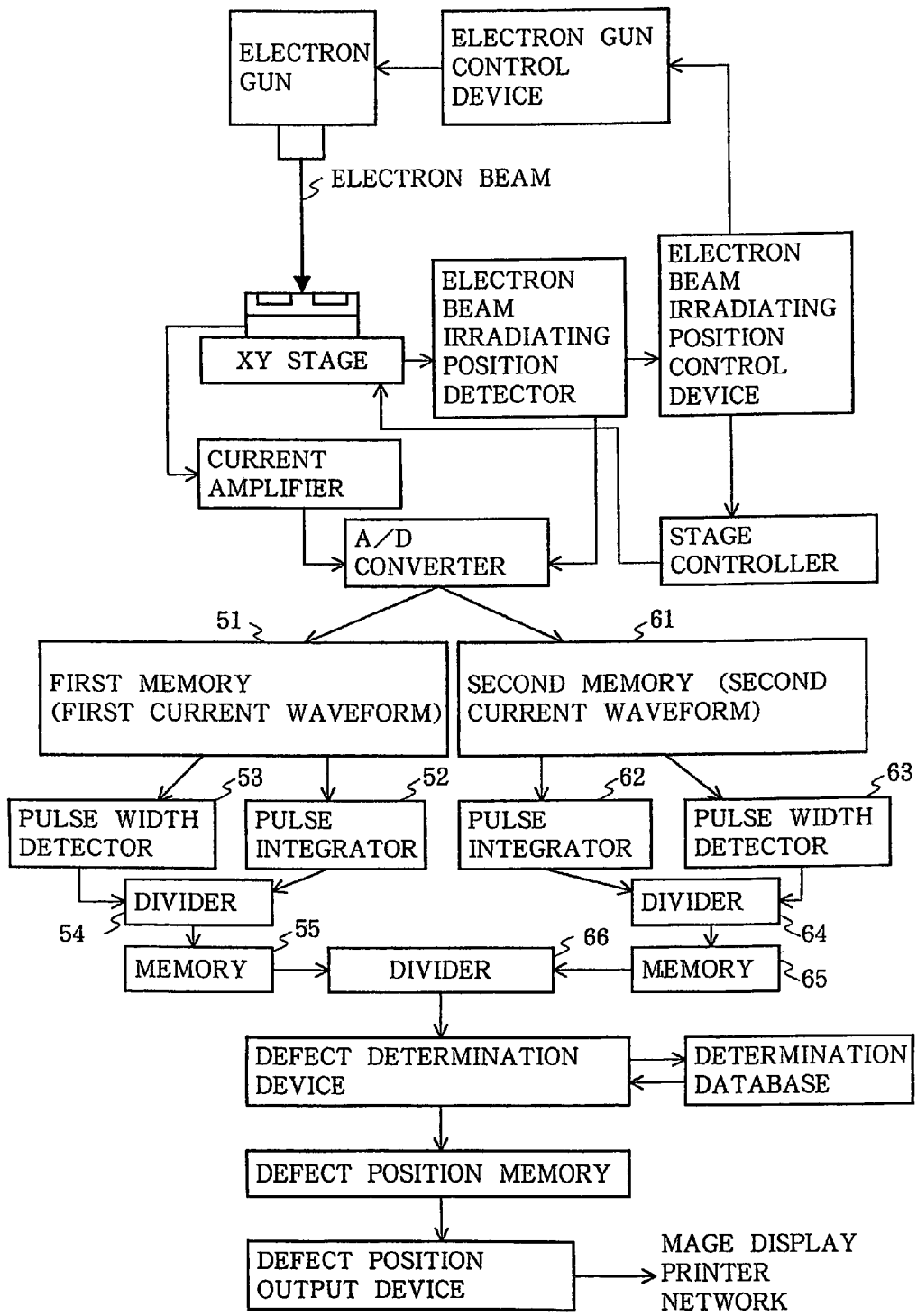
FIG. 18 is a block diagram showing a construction of a semiconductor device tester according to a sixth embodiment of the present invention.
Figure 19:
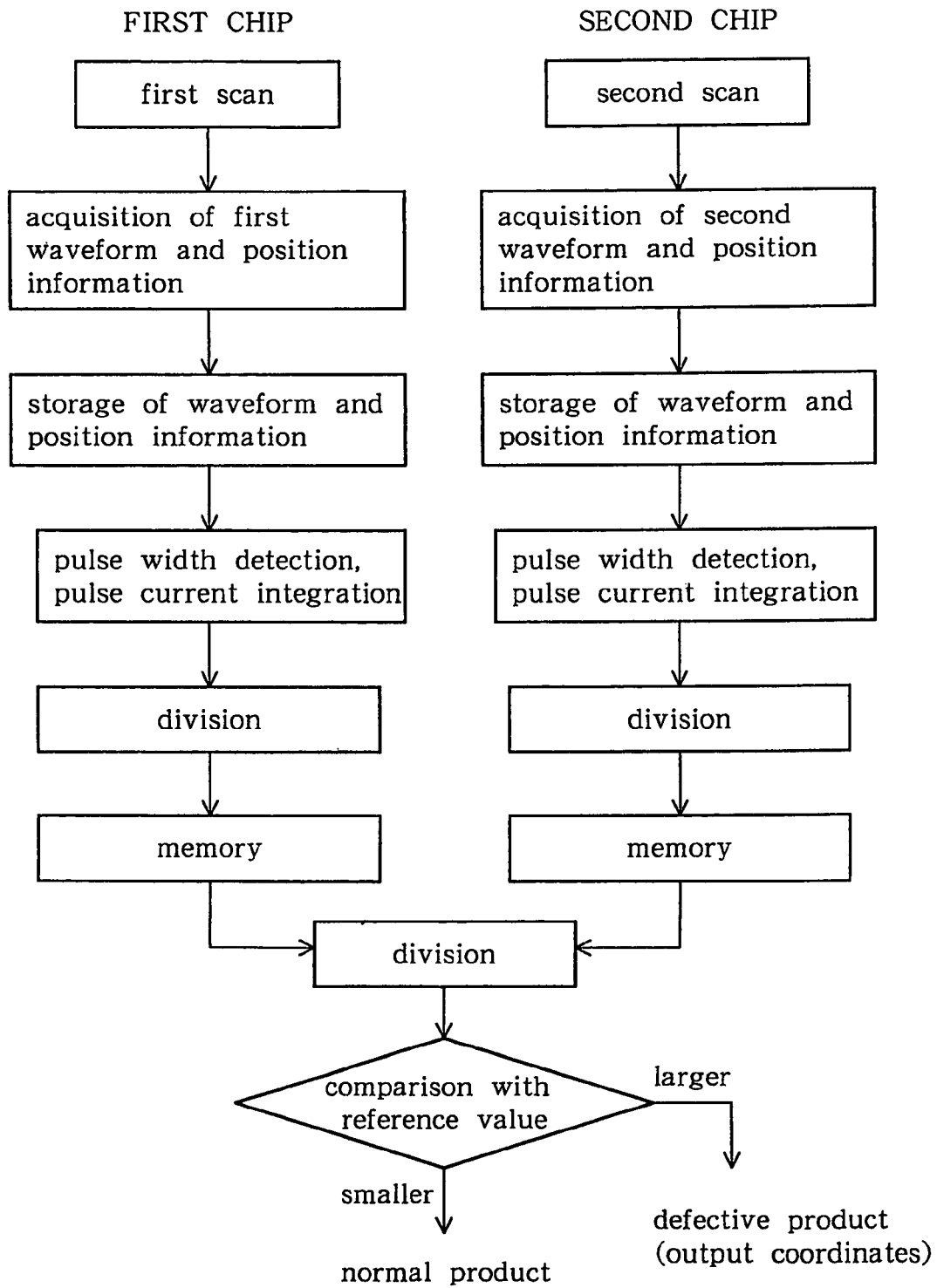
FIG. 19 is a flowchart of a device test using the semiconductor device tester shown in FIG. 18.

FIG. 18 is a block diagram of a semiconductor device tester according to a fifth embodiment and FIG. 19 is a flowchart showing an operation of the device tester shown in FIG. 18.

The semiconductor device tester according to the fifth embodiment differs from the fourth embodiment in that the device tester shown in FIG. 18 includes, in parallel to the memory 51, the pulse integrator 52, the pulse width detector 53, the divider 54 and the memory 55, a memory 61, a pulse integrator 62, a pulse width detector 63, a divider 64 and a memory 65 and further includes a divider 66 for dividing a current value stored in the memory 55 by a current value stored in the memory 65 and in that a comparison test is performed by using a plurality of chips on a single substrate.

The fifth embodiment may be used in a mass production factory in which a production is stable to some extent. As in the fourth embodiment, current waveforms obtained by irradiating a first and second test samples with electron beam are stored in the memory 51 and the memory 61, respectively. Then, values of currents flown from a rising edge to a falling edge of one pulses belonging to measured current waveforms are integrated by the pulse integrators 52 and 62 to obtain total currents flown within the pulses, respectively. On the other hand, widths L measured from rising edges to falling edges of the pulse waveforms, which are equal to crossing distances of the contact holes, are obtained by the pulse width detectors 53 and 63. Thereafter, the total currents obtained by the pulse integrators 52 and 62 are divided by a square of the width L by using the dividers 54 and 64. According to this arithmetic operation, values of currents flowing through unit areas of the contact holes are obtained regardless of a scan locus of the electron beam. After the values obtained from the first and second test samples are stored in the memories 55 and 65, respectively, the values stored in the memories are further divided mutually by the divider 66. The defect-determining device 26 compares an output of the divider 66 with a reference value. The reference value defines an allowable difference between chips. When a result of the comparison at a position is large, a defect is determined in that position. Therefore, coordinates of that position is stored in the defect position memory 28 and outputted to an image display, a printer and/or a network through the defect position output device 29.

Figure 20:
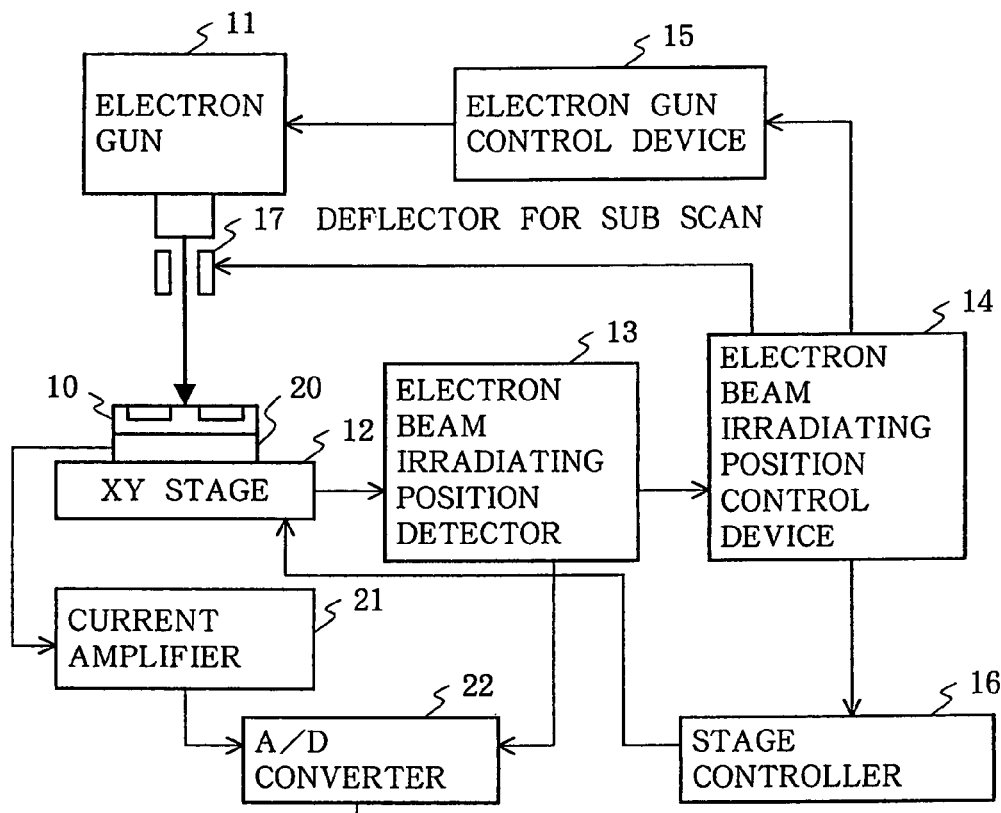
FIG. 20 shows a construction of a semiconductor device tester for substantially improving the test speed when the test is performed by using thin electron beam.

FIG. 20 shows a modification of the second embodiment, for substantially improving the test speed when a test is performed by using thin electron beam. In this modification, a electron beam deflector 17 for sub scan is provided and a sun scan of a test sample is performed simultaneously with the main scan performed by the XY stage 12 for determining the wafer position.

The main scan is performed by moving the XY stage 12. However, it is difficult to stably move the XY stage 12 at a speed exceeding 1 m/sec at present. Since the current measuring test is performed at very high speed, the upper limit of the test speed is defined by the scanning speed. In view of this fact, a high speed sub scan is performed in a direction perpendicular to the main scan direction simultaneously with the main scan such that the test speed is improved. Since the sub scan is performed by deflecting electron beam, the sub scan speed is several ten thousands times the moving speed of the XY stage. When a sub scan distance is small, it is possible to utilize a usual electron beam deflector since the incident angle of electron beam is substantially 90 degree and there is no influence on the test. When sub scan distance is large, a beam shifter for moving electron beam in parallel is utilized.

Figure 21:
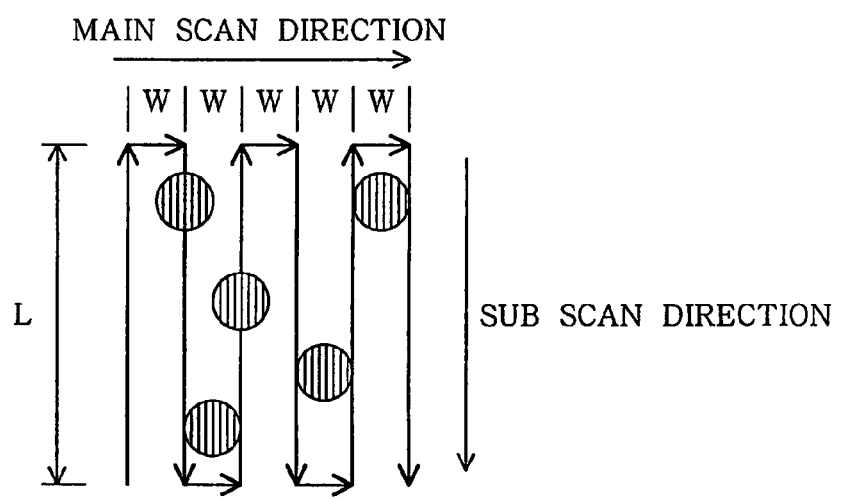
FIG. 21 shows an example of a electron beam scan locus.

FIG. 21 shows an example of a scan locus. In this example, a high-speed sub scan is performed reciprocally within a constant distance while the main scan is performed in a constant direction at low speed. An interval of the reciprocating parallel sub scan lines in the main scan direction is substantially equal to the diameter of the contact hole to be tested. Therefore, the test sample is scanned at a speed corresponding to a product of the main scan speed and the sub scan speed, so that the test speed can be substantially improved.

Figure 22:
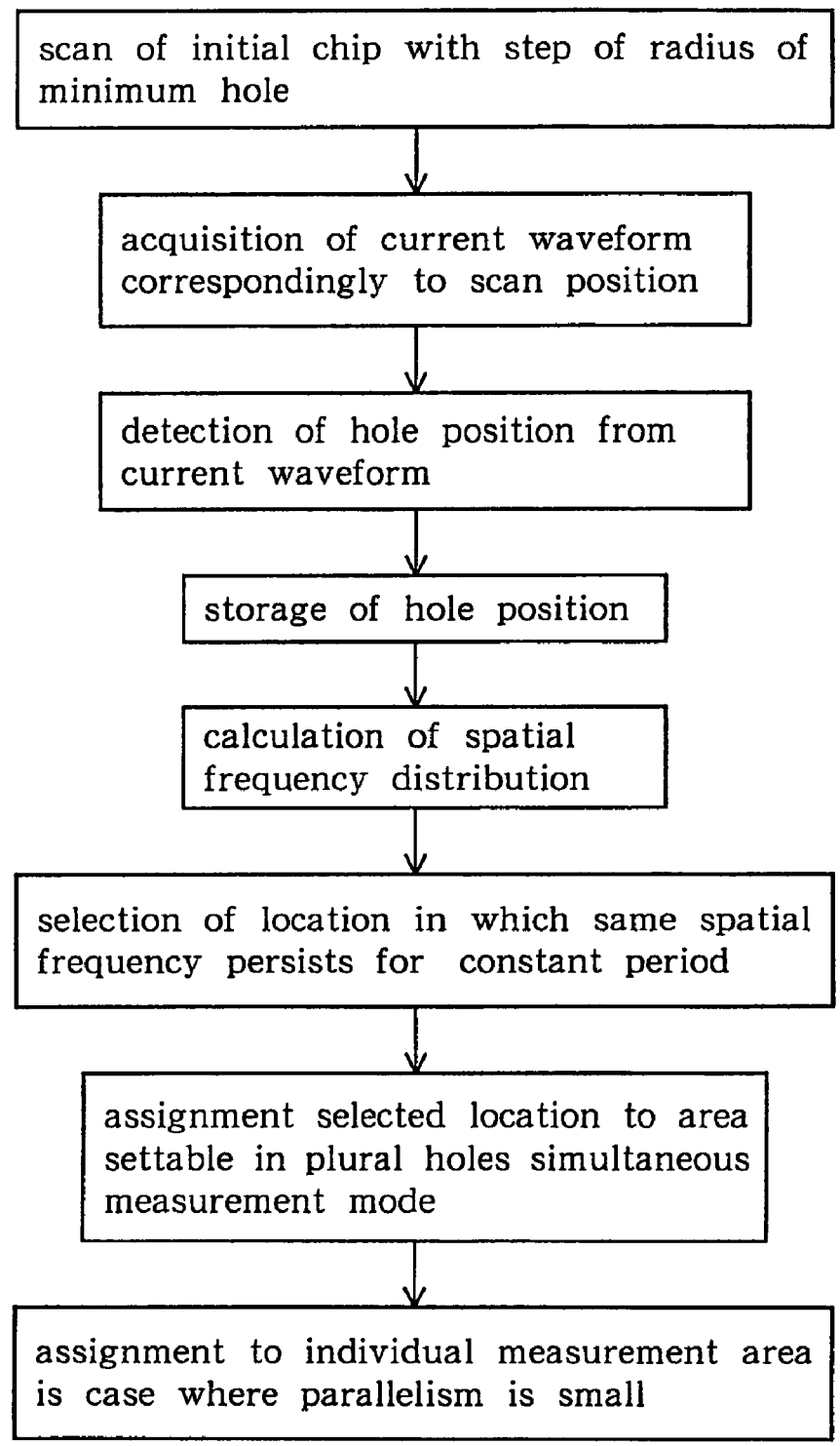
FIG. 22 is a flowchart of a test method of a semiconductor device, which includes, on a single chip, an area in which contact holes are arranged at random and an array area in which contact-holes are arranged with constant interval, for testing the array area separately from other areas.
Figure 23:
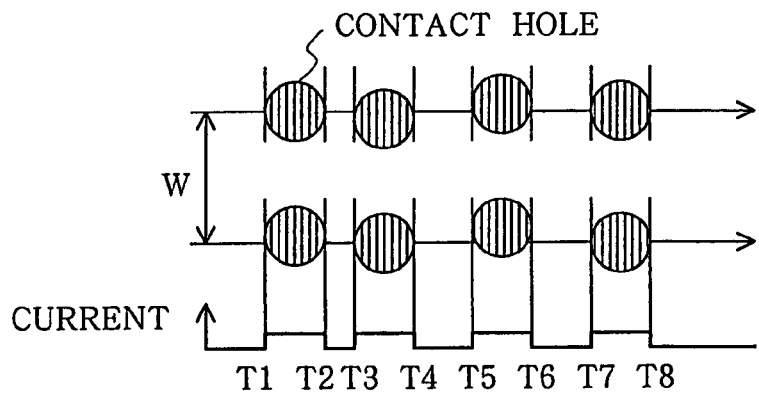
FIG. 23 shows an example of contact hole arrangement.
Figure 24:
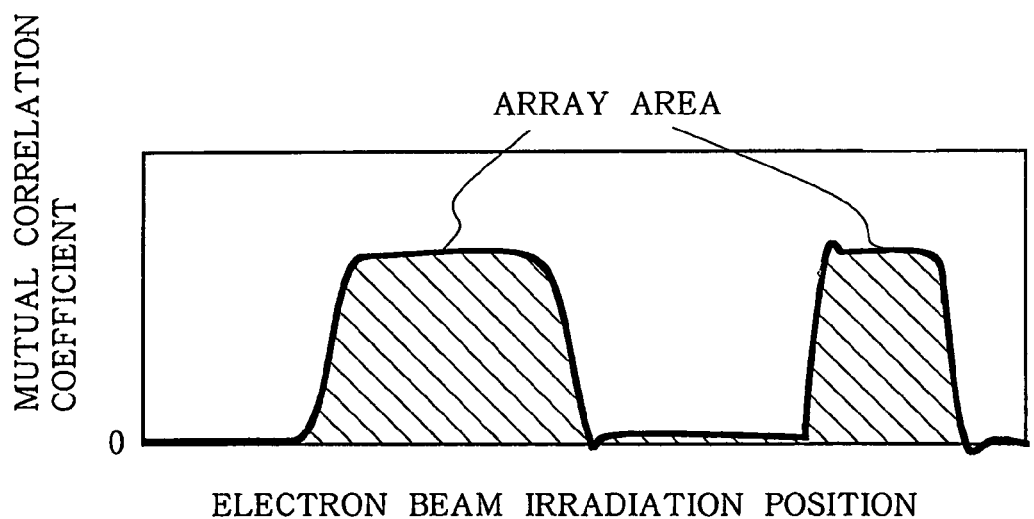
FIG. 24 is a power spectrum showing a spatial distribution of contact hole positions.

FIG. 22 to FIG. 24 show a test method for a device having a chip including an area in which contact holes are arranged at random and an array area in which elements are to be arranged, which are arranged at a regular interval, in which FIG. 22 is a flowchart of a method for separately testing such array area from other areas, FIG. 23 shows an example of arrangement of contact holes and FIG. 24 is a power spectrum showing a spatial distribution of a position of a contact hole.

In such as a SOC device, an array area in which contact holes for memories, etc., and random logic circuits are arranged at a regular interval along a long distance is provided. If the device includes only the array area, the conventional high speed test method for obtaining a defect rate by irradiating a plurality of contact holes with electron beam simultaneously can be applied. However, such test can not be performed for the case of random logic. According to the method shown by the flowchart in FIG. 22, an array area is automatically extracted from a test sample without using a layout information from CAD, etc., and the array area and other areas are tested separately.

That is, a current waveform is obtained by testing a first test sample by using electron beam having width in a direction perpendicular to the scan direction, which is substantially equal to or smaller than a diameter of a contact hole. By using such electron beam, it is possible to detect contact holes existing along the scan direction. The positions of the contact holes are temporarily stored and, then, the spatial distribution of the contact hole positions is frequency-analyzed every certain specific section (for example, several tens to several hundreds microns). The position dependency of the power spectrum such as shown in FIG. 24 is obtained. Since power in an area in which mutual correlation is strong is large, an existence of array in that area is detected. On the contrary, an area in which correlation is smaller than 1 indicates the random logic area. The test speed on the array portion can be improved by applying the conventional high speed test method for obtaining a defect rate by irradiating a plurality of contact holes with electron beam simultaneously.

Figure 25:
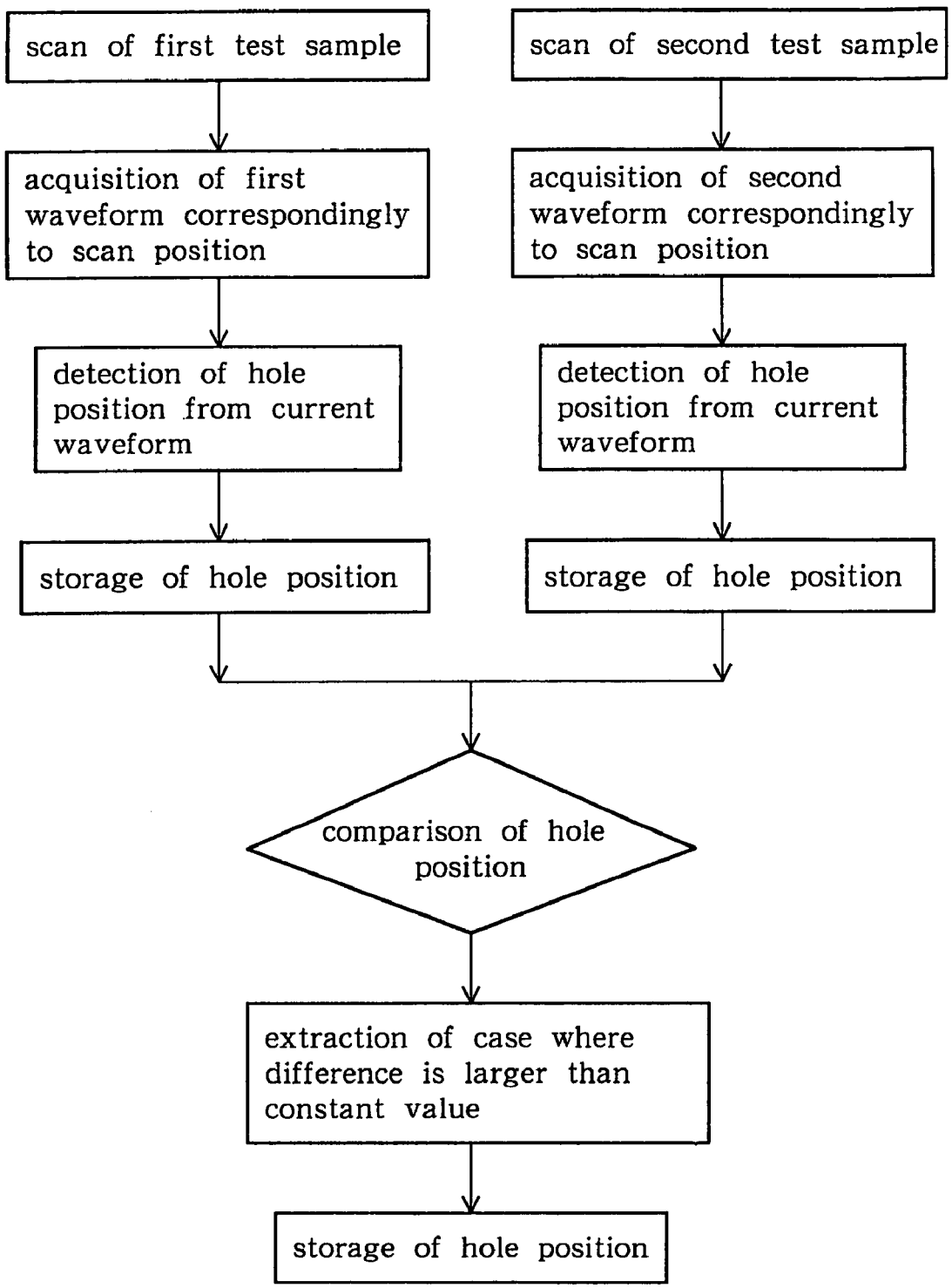
FIG. 25 is a flowchart of a method for determining the quality of contact hole by utilizing a positional information of a current waveform.
Figure 26A:
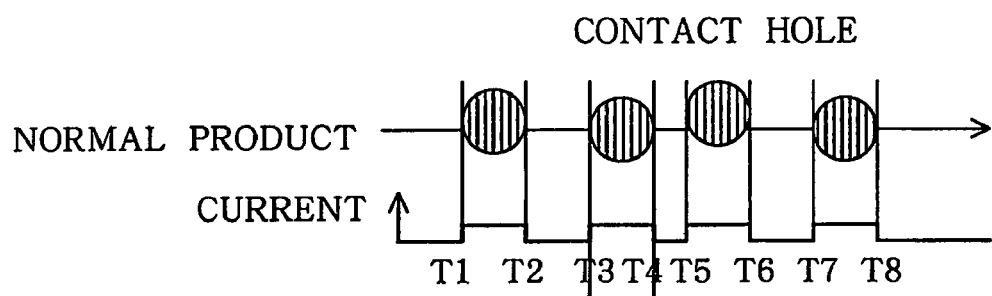
FIG. 26a and FIG. 26b show test examples of normal and defective chips, respectively.
Figure 26B:
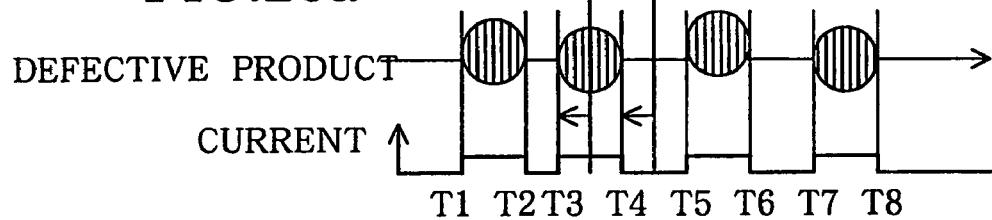

FIG. 25 and FIG. 26 shows a method for determining the quality of contact hole by utilizing a positional information of current waveform, in which FIG. 25 is a flowchart thereof and FIG. 26 shows a test example obtained by the method. In this method, a first test sample is scanned to obtain a current waveform and a contact hole position in the first test sample is determined, as in the preceding example. Then, a second test sample is scanned to obtain a current waveform and a contact hole position in the second test sample is determined. The measured contact hole positions are compared and, when there is a positional deviation larger than a constant value, the contact hole is determined as defective. Simultaneously therewith, the position is stored in a memory.

In the described embodiments, electron beam having thin rectangular cross section. However, the present invention can be applied with using electron beam having other cross sectional length and/or configuration than the thin rectangular. For example, electron beam having circular, ellipsoidal or square cross section may be used according to a test object. Further, an area to be irradiated with electron beam is not always continuous. Although the intensity of electron beam irradiation is preferably constant within areas to be irradiated simultaneously, the comparison test is possible if the electron beam intensity is equal to or higher than a constant value. In order to perform the measurement more accurately, the distribution of electron beam irradiation is preferably known. Electron beam irradiation may be performed continuous or intermittently. It is not always necessary to scan different positions by electron beam. It is possible to scan areas by overlapping small portions thereof. Acceleration voltage and/or injection current of electron beam can be selected optimally according to a sample to be tested. The electron beam irradiating position detector may be any detector capable of detecting a physical amount, which is changed correspondingly to a distance, such as the optical detector, a detector using electromagnetic wave, a detector using electric resistance, a detector using capacitance or a measuring device based on quantum mechanics.

As described hereinbefore, according to the present invention, the quality of a plurality of test samples is determined by comparing measured values of currents flowing through the respective test samples. Therefore, there is no need of displaying the state of contact hole as a secondary electron image and any complex device for secondary electron image display is not required. According to the present invention, the quality of randomly arranged contact holes can be tested without using CAD data. Since it is unnecessary to exchange a large amount of CAD data between devices, the transfer of a large amount of data between a large memory and a CPU is not required so that the test speed can be improved. Further, the capacity of the memory therefor can be reduced. In addition, the simultaneous test of a plurality of contact holes is possible even when the contact holes are arranged at random and the test speed of the contact holes can be improved.

In the present invention, it is possible to acquire an information effective in the test regardless of a position of the contact hole through which electron beam passes and it is not always necessary to irradiate a specific position of the contact hole with electron beam. Since the quality of contact hole is tested by utilizing the positional information of the contact hole, the test may be possible even when a clear result of test is not always obtainable from only a variation of a bottom of the contact hole.

It is general that the test speed of a case where a plurality of contact holes arranged in an array can be easily improved, compared with the test speed of a case where a plurality of contact holes are arranged at random and that the arrayed contact holes and the randomly arranged contact holes are mixed in a chip. In the present invention, the speed-up of test is possible by preliminarily checking the arrangement of contact holes in an initial test, estimating a location, in which the contact holes are arranged in an array, from a frequency distribution of measured currents and selecting an optimal test method on the basis of the estimated information.

In a case where the sub scan of electron beam is employed, it is possible to improve the effective scan speed, so that the test speed can be further improved.

What is claimed is:

1. A method of testing a semiconductor wafer having first and second areas, each of which includes at least one contact or via hole, the method comprising:
scanning an electron beam across the first area;
measuring a first current waveform generated in response to the scanning of the electron beam across the first area, while obtaining first coordinates information indicative of irradiating positions of the electron beam in the first area;
determining a first location of the contact or via hole in the first area using the first current waveform and the first coordinates information;
scanning an electron beam across the second area;
measuring a second current waveform generated in response to scanning the electron beam across the second area, while obtaining second coordinates information indicative of irradiating positions of the electron beam in the second area; and determining a second location of the contact or via hole in the second area using the second current waveform and the second coordinates information; and comparing the first location and the second location to detect a difference therebetween.

2. The method of claim 1 wherein comparing the first location and the second location includes comparing amplitudes of the first current waveform with amplitudes of the second current waveform.

3. The method of claim 2 wherein measuring the first current waveform includes measuring the magnitude and polarity of the first current waveform.

4. The method of claim 1 wherein the electron beam has a rectangular cross-section.

5. The method of claim 1 wherein the electron beam has a width that is less than the contact or via hole in the first area.

6. The method of claim 1 wherein the electron beam has a circular cross-section.

7. The method of claim 1 further comprising displaying bit map information indicative of the first location.

8. The method of claim 1 further comprising:
comparing the difference between the first location and the second location with a predetermined value; and
detecting a defect in at least one of the contact or via hole in the first area and the contact or via hole in the second area when the difference is greater than the predetermined value.

9. A method of testing a semiconductor wafer having first and second areas, each of which includes a plurality of contacts or via holes which are arranged in the same or substantially the same pattern, the method comprising:
scanning an electron beam across the first area;
measuring a first current waveform generated in response to the scanning of the electron beam across the first area, while obtaining first coordinates information indicative of irradiating positions of the electron beam in the first area;
determining a first location of the contacts or via holes in the first area using the first current waveform and the first coordinates information;
scanning an electron beam across the second area;
measuring a second current waveform generated in response to the scanning of the electron beam across the second area, while obtaining second coordinates information indicative of irradiating positions of the electron beam in the second area;
determining a second location of the contacts or via holes in the second area using the second current waveform and the second coordinates information; and
comparing the first location and the second location to detect a difference therebetween.

10. The method of claim 9 wherein comparing the first location and the second location includes comparing amplitudes of the first current waveform with amplitudes of the second current waveform.

11. The method of claim 9 wherein the electron beam has a rectangular cross-section.

12. The method of claim 9 wherein the electron beam has a width that is less than at least one of the contacts or via holes in the first area.

13. The method of claim 9 wherein the electron beam has a circular cross-section.

14. The method of claim 9 further comprising displaying first bit map information indicative of the first location.

15. The method of claim 14 further comprising displaying second bit map information indicative of the second location.

16. The method of claim 9 further comprising:
comparing the difference between the first location and the second location with a predetermined value; and
detecting a defect in at least one of the contacts or via holes in the first area and the contacts or via holes in the second area when the difference is greater than the predetermined value.

* * * * *